(12) United States Patent
Doi

(10) Patent No.: US 7,884,543 B2
(45) Date of Patent: Feb. 8, 2011

(54) METHOD OF FORMING WIRING OF LIGHT EMITTING DEVICE, SUBSTRATE FOR MOUNTING LIGHT EMITTING DEVICE, DISPLAY, BACK LIGHT, ILLUMINATING APPARATUS AND ELECTRONIC APPLIANCE

(75) Inventor: Masato Doi, Kanagawa (JP)

(73) Assignee: Sony Corporation, Tokyo (JP)

( * ) Notice: Subject to any disclaimer, the term of this patent is extended or adjusted under 35 U.S.C. 154(b) by 534 days.

(21) Appl. No.: 11/866,714

(22) Filed: Oct. 3, 2007

(65) Prior Publication Data

US 2008/0265744 A1 Oct. 30, 2008

(30) Foreign Application Priority Data

Oct. 12, 2006 (JP) ............................ P2006-279074

(51) Int. Cl.
H01J 1/62 (2006.01)
H01J 63/04 (2006.01)
H01L 33/00 (2010.01)

(52) U.S. Cl. ...................... 313/506; 313/498; 313/512; 445/24; 257/98

(58) Field of Classification Search ......... 313/490–512; 445/24–25; 257/81, 91, 95, 98–100; 438/22
See application file for complete search history.

(56) References Cited

U.S. PATENT DOCUMENTS

| 6,444,998 B1 * | 9/2002 | Taniguchi et al. ............. 257/13 |
| 6,583,446 B1 * | 6/2003 | Taninaka et al. ............. 257/93 |
| 6,855,958 B2 * | 2/2005 | Sato et al. ..................... 257/79 |
| 2004/0076016 A1 * | 4/2004 | Sato et al. .................... 362/555 |
| 2005/0199885 A1 * | 9/2005 | Hata et al. ..................... 257/79 |
| 2006/0278886 A1 * | 12/2006 | Tomoda et al. ................ 257/99 |
| 2007/0063215 A1 * | 3/2007 | Kohda ........................ 257/103 |
| 2007/0085093 A1 * | 4/2007 | Ohmae et al. .................. 257/89 |
| 2007/0278505 A1 * | 12/2007 | Yamamoto et al. ............ 257/91 |
| 2007/0286252 A1 * | 12/2007 | Ha et al. .................. 372/50.12 |

FOREIGN PATENT DOCUMENTS

| JP | 55-124180 | 9/1980 |
| JP | 06-302856 | 10/1994 |
| JP | 2001-177149 | 6/2001 |
| JP | 2004-006919 | 1/2004 |
| JP | 2004-014676 | 1/2004 |
| JP | 2004-140090 | 5/2004 |
| JP | 2004-289182 | 10/2004 |
| JP | 2005-079262 | 3/2005 |
| JP | 2006-212584 | 8/2006 |

OTHER PUBLICATIONS

Office Action dated Mar. 24, 2009, for corresponding Japanese Application No. 2006-279074.

* cited by examiner

*Primary Examiner*—Sikha Roy
*Assistant Examiner*—Jose M Diaz
(74) *Attorney, Agent, or Firm*—K&L Gates LLP

(57) ABSTRACT

A method of forming a wiring of a light emitting device having an electrode on a light emission surface is disclosed. The method includes: forming the electrode nearly in a linear shape in which the width is narrower than the light emission surface; and forming a wiring that is connected to the electrode nearly in a linear shape in which the width is narrower than the light emission surface to cross the electrode.

11 Claims, 18 Drawing Sheets

LIGHT

METHOD OF FORMING WIRING OF LIGHT EMITTING DEVICE, SUBSTRATE FOR MOUNTING LIGHT EMITTING DEVICE, DISPLAY, BACK LIGHT, ILLUMINATING APPARATUS AND ELECTRONIC APPLIANCE

CROSS REFERENCES TO RELATED APPLICATIONS

The present application claims priority to Japanese Patent Application JP 2006-279074 filed in the Japanese Patent Office on Oct. 12, 2006, the entire contents of which is being incorporated herein by reference.

BACKGROUND

The present application relates to a method of forming a wiring of a light emitting device, a substrate for mounting a light emitting device, a display, a back light and an electronic appliance, particularly suitable for a substrate for mounting a light emitting device in which a minute light emitting device, for example, a light emitting diode is mounted on the substrate and then a wiring is formed thereon, and a display, a back light and an electronic appliance using the substrate for mounting a light emitting device.

As a light emitting device, for example, a light emitting diode, there are a light emitting diode in which a p-side electrode and an n-side electrode are formed on one side, and a light emitting diode in which a p-side electrode and an n-side electrode are separately formed on a light emission surface (the surface to take out light) and on a surface on the opposite side thereof (the back side). An example of the former light emitting diode is shown in FIGS. 14a and 14B, and an example of the latter light emitting diode is shown in FIGS. 15A and 15B. Here, FIGS. 14A and 14B show a plan view and a cross section, respectively. In addition, FIGS. 15A and 15B show a cross section and a bottom view, respectively.

In the light emitting diode shown in FIGS. 14A and 14B, the structure of a light emitting diode is formed of an n-type semiconductor layer 101, a light emitting layer (an active layer) 102 and a p-type semiconductor layer 103, in which a p-side electrode 104 is formed on the p-type semiconductor layer 103, and an n-side electrode 105 is formed on the n-type semiconductor layer 101. Connecting conductive materials 106 and 107 are formed on the p-side electrode 104 and the n-side electrode 105, respectively. In this case, the back side of the n-type semiconductor layer 101 is the light emission surface. A protective insulating resin 108 is formed so as to cover the surfaces except the light emission surface and the connecting conductive materials 106 and 107 in the light emitting diode.

In the light emitting diode shown in FIGS. 15A and 15B, the structure of a light emitting diode is formed of an n-type semiconductor layer 101, a light emitting layer 102 and a p-type semiconductor layer 103, in which a p-side electrode 104 is formed on the p-type semiconductor layer 103, and an n-side electrode 105 in a linear shape is formed on one side of the back side of the n-type semiconductor layer 101 that is the light emission surface. A connecting conductive material 106 is formed on the p-side electrode 104. A protective insulating resin 108 is formed so as to cover the surfaces except the light emission surface and the connecting conductive material 106 in the light emitting diode.

FIGS. 16A and 16B show the state in which the light emitting diode shown in FIGS. 14A and 14B is mounted on a substrate and wirings are formed thereon. Here, FIGS. 16A and 16B show a plan view and a cross section, respectively. As shown in FIGS. 16A and 16B, in this example, the light emitting diode is mounted on a transparent substrate 201 as the n-type semiconductor layer 101 is turned down, an insulating resin 202 is buried so that the connecting conductive materials 106 and 107 are exposed around the light emitting diode, and then a wiring 203 which is connected to the connecting conductive material 106 and a wiring 204 which is connected to the connecting conductive material 107 are formed on the insulating resin 202. In this case, the wirings 203 and 204 are lead to the opposite sides to each other.

FIGS. 17A and 17B show the state in which the light emitting diode shown in FIGS. 15A and 15B is mounted on a substrate and wirings are formed. Here, FIGS. 17A and 17B show a plan view and a cross section, respectively. As shown in FIGS. 17A and 17B, in this example, the light emitting diode is mounted on a wiring 203 which is formed in advance on a substrate 201 as the connecting conductive material 106 is turned down, an insulating resin 202 is buried so that the light emission surface is exposed around the light emitting diode, and then a wiring 204 which is connected to the n-side electrode 105 is formed on the insulating resin 202 as the wiring 204 is lead to the opposite side of the wiring 203.

In addition, in a light emitting diode array having a center electrode type light emitting diode part in which an ohmic contact layer is disposed at the center of a light emission surface and light emission surfaces on both sides thereof emit light, such a technique is proposed that the ohmic contact layer is configured of a base part which passes through the center of the light emission surface and branch parts which are extended in the direction crossing the direction in which a bonding electrode is led from the base part, and ohmic electrodes are provided on the ohmic contact layer as tracing the shapes of the base part and the branch part (see Patent Reference 1 (JP-A-2004-14676)). However, this technique is greatly different in technical principles from the light emitting device according an embodiment in which an electrode on the light emission surface is formed nearly in a linear shape having the width narrower than that of the light emission surface, a wiring connected to the electrode is formed nearly in a linear shape having the width narrower than that of the light emission surface, and the wiring is crossed to the electrode.

From the viewpoint of easiness to form a wiring after mounted, as compared with the light emitting diode shown in FIGS. 14A and 14B in which the p-side electrode 104 and the n-side electrode 105 are formed on one side, the light emitting diode shown in FIGS. 15A and 15B is more preferable in which the n-side electrode 105 and the p-side electrode 104 are separately formed on the light emission surface and on the surface on the opposite side thereof. In the light emitting diode shown in FIGS. 15A and 15B, it is desirable that the n-side electrode 105 to be formed on the light emission surface is as small as possible in order to suppress the light blocking against the light emission surface due to the n-side electrode 105. In addition, in the case in which the light emitting diode is mounted and then the wiring 204 is formed which is connected to the n-side electrode 105 on the light emission surface, it is necessary to form the wiring 204 as well not to block light against the light emission surface as much as possible. Moreover, the light blocking area on the light emission surface is greatly changed in the cases in which the position is shifted in mounting the light emitting diode on the substrate 201 and in which the position is shifted in forming the wiring 204, causing the brightness is varied, which has to be prevented. However, in practice, it is actually difficult to satisfy all of these demands.

Then, a method shown in FIGS. 18A and 18B is proposed by the inventor as a method of forming a wiring that satisfies these demands. Here, FIGS. 18A and 18B show a plan view and a cross section, respectively. As shown in FIGS. 18A and 18B, in the method, a transparent electrode 205 formed of ITO (indium tin oxide) is formed to cover the entire light emission surface so that an n-side electrode 105 formed on the back side of an n-type semiconductor layer 101 that is the light emission surface is connected to a wiring 204 formed on an insulating resin 202.

However, in the method of forming a wiring shown in FIGS. 18A and 18B, in practice, it is difficult to connect the n-side electrode 105 on the light emission surface to the wiring 204 formed on the insulating resin 202 with no breaks of the transparent electrode 205, and materials for use in forming the transparent electrode 205 are relatively expensive, causing a problem that fabrication costs for a mounting substrate are increased.

SUMMARY

Thus, it is desirable to provide a method of forming a wiring of a light emitting device which can reliably connect an electrode on a the light emission surface to a wiring even though the position of a light emitting device is shifted in mounting the light emitting device on a substrate, and the position of a wiring is shifted in forming the wiring as well as which can prevent the fluctuations in brightness of the light emitting device caused by the position shift of the light emitting device and the position shift of the wiring, and a substrate for mounting a light emitting device using the same.

It is also desirable to provide a display, a back light, an illuminating apparatus and an electronic appliance using an excellent substrate for mounting a light emitting device as described above.

A method of forming a wiring of a light emitting device according to an embodiment is a method of forming a wiring of a light emitting device having an electrode on a light emission surface, the method including the steps of: forming the electrode nearly in a linear shape in which the width is narrower than the light emission surface; and forming a wiring that is connected to the electrode nearly in a linear shape in which the width is narrower than the light emission surface to cross the electrode.

From a viewpoint of reliably connecting the electrode to the wiring even though the position shift of the light emitting device or the position shift of the wiring occurs, the width of the electrode on the light emission surface in the longitudinal direction is preferably selected as long as possible within the range not exceeding the width of the light emission surface of the electrode in the longitudinal direction, which is not restricted thereto. Typically, the electrode is selected in an elongated rectangular shape, which is not restricted thereto, and any shapes may be selected as long as the shape is an elongated shape. Preferably, the width in the direction orthogonal to the longitudinal direction of the electrode is selected so that blocking the light of the light emission surface can be suppressed as much as possible as well as a sufficient contact area can be secured to intend a reduced contact resistance. Typically, the electrode is formed near the center of the light emission surface, which is not restricted thereto. From a viewpoint of reliably connecting the electrode to the wiring, preferably, the wiring that is connected to the electrode is formed so as to completely longitudinally cross the light emission surface, which is not restricted thereto. In addition, preferably, the wiring is formed so as to almost orthogonally cross the electrode, which is not restricted thereto. The wiring may obliquely cross the electrode. Typically, the electrode and the wiring are formed of a metal or an alloy, but a part or all the part may be formed of a transparent conductive material such as ITO depending on the cases. The shape of the light emission surface is selected as necessary. For example, the outer part of the light emission surface may have a portion almost in parallel with the wiring, or a portion that almost orthogonally crosses the wiring. For example, the shape of the light emission surface may be a polygon, that is, a triangle, a square, a rectangle, a pentagon, a hexagon, and an octagon, or a shape having the corners of these polygons cut, or a shape having the polygons deformed regularly or irregularly, or a circular shape, an ellipse or a shape having the shapes deformed regularly or irregularly.

The maximum dimensions of the light emission surface or the light emitting device can be decided as necessary. However, generally, for example, the dimensions are 1 mm or below, or 300 μm or below, or 100 μm or below, preferably, 50 μm or below, typically 30 μm or below, or more typically 25 μm or below. Typically, the light emitting device is a light emitting diode, which is not restricted thereto.

From a viewpoint of improving the efficiency of taking light out of the light emission surface, preferably, the light emitting device is a light emitting diode that has an end surface in which the semiconductor layer forming the structure of the light emitting diode is tilted at an angle $\theta_1$ to the main plane and has a reflector outside the end surface, the reflector at least partially including a portion that is faced to the end surface and tilted to the main plane at an angle $\theta_2$ smaller than the angle $\theta_1$. The semiconductor layer forming the structure of the light emitting diode includes a first semiconductor layer of a first conductive type, a light emitting layer and a second semiconductor layer of a second conductive type. Typically, the plane shape of the semiconductor layer is a circular shape, which may be other shapes, such as an ellipse, in which all or the part of a circle is deformed regularly or irregularly, as necessary. Alternatively, it may be a polygon or a shape in which all or the part of the polygon is deformed regularly or irregularly. Typically, the sectional shape of the semiconductor layer has a trapezoid, a rectangle or a reverse trapezoid, but may have a shape deformed from these shape. In addition, typically, the tilt angle $\theta_1$ of the end surface of the semiconductor layer is constant, which may not be necessarily so, and may be changed in the end surface. From a viewpoint of improving the efficiency of taking out light, preferably, between the end surface of the semiconductor layer and the reflector, a transparent resin is formed that has a refractive index smaller than the refractive index of the semiconductor layer (greater than the refractive index of air). Various materials may be used for the transparent resin, and the material is selected as necessary. The transparent resin can be formed according to various methods. More specifically, for example, the transparent resin may be formed in such ways that it is formed by spin coating, a resin is formed so as to cover at least the end surface and is cured and shrunk, it is formed by photolithography technique using a photosensitive resin, a resin is press formed, it is formed by thermal imprinting, it is shaped by ultraviolet (UV) imprinting, and it is formed by curing a resin in the state in which the resin is pressed against a plastically deformable mold release layer. Similarly, from a viewpoint of improving the efficiency of taking out light, preferably, the thickness of the semiconductor layer is 0.3 μm to 10 μm or below, and the ratio of the thickness of the semiconductor layer to the maximum diameter of the semiconductor layer is 0.001 to 2 or below. As described above, preferably, the maximum diameter of the semiconductor layer is 50 μm or below, typically 30 μm or below, and more typically 25 μm or below. In addition, preferably, in the case in which the semiconductor layer has a first electrode and a second electrode on the light emission surface and the surface on the opposite side of the light emission surface, respectively, the reflector has ohmic contact to the second electrode to serve as a part of the second electrode or a part of the wiring of the second electrode. In addition, preferably, the reflector is formed so as to at least include an area in which the end surface is projected onto the area in which the reflector is formed in the direction orthogonal thereto where 30 degrees$\leq \theta_1 \leq$90 degrees, whereas so as to include an area in which the end surface is projected onto the area in which the reflector is formed in the direction in which the direction orthogonal thereto is returned on the light emission surface of the semiconductor layer where 90 degrees$<\theta_1 \leq$150 degrees. In addition, preferably, the reflector may be extended on the surface on the opposite side of the light emission surface of the semiconductor layer. In addition, preferably, the conditions may be as below:

$$\theta_2(\theta_1-\sin^{-1}(n_3/n_2))/2 \text{ and } \theta_2 \leq \theta_1/2,$$

where 30 degrees $\theta_1 \leq$ 150 degrees and 30 degrees$\leq \theta_1 \leq$90 degrees, and $$\theta_2 \geq ((\theta_1-90)-\sin^{-1}(n_3/n_2))/2\theta_2 \text{ and } \theta_2 \leq (\theta_1-90)/2,$$

where 90 degrees$<\theta_1$ 150 degrees, where the refractive index of the transparent resin is $n_2$, and the refractive index of the external medium of the transparent resin (for example, air) is $n_3$. In some cases, the reflection surface of the reflector facing to the end surface of the semiconductor layer has a plane, and the reflection surface has a portion of a curved surface. In addition, preferably, the semiconductor layer may have a first electrode and a second electrode on the light emission surface and the surface on the opposite side of the light emission surface, respectively, and the first electrode is formed so as to avoid the area in which the end surface is projected onto the light emission surface of the semiconductor layer in the orthogonal direction.

For materials used for the semiconductor layer forming the structure of the light emitting diode, that is, the first semiconductor layer, the light emitting layer and the second semiconductor layer, basically any semiconductors may be used, which may be any one of inorganic semiconductors and organic semiconductors. For example, semiconductors having wurtzite crystal structures or cubic crystal structures may be used. For semiconductors having wurtzite crystal structures, nitride three-five compound semiconductors, two-six compound semiconductors such as BeMgZnCdS compound semiconductors and BeMgZnCdO compound semiconductor, and oxide semiconductors such as ZnO are named. Most generally, nitride three-five compound semiconductors are formed of $Al_xB_yGa_{1-x-y-z}In_zAs_uN_{1-u-v}P_v$ (where, $0 \leq x \leq 1$, $0 \leq y \leq 1$, $0 \leq z \leq 1$, $0 \leq u \leq 1$, $0 \leq v \leq 1$, $0 \leq x+y+z<1$, $0 \leq u+v<1$), and more specifically, $Al_xB_yGa_{1-x-y-z}In_zN$ (where, $0 \leq x \leq 1$, $0 \leq y \leq 1$, $0 \leq z \leq 1$, $0 \leq x+y+z<1$), and typically, $Al_xGa_{1-x-z}In_zN$ (where, $0 \leq x \leq 1$, $0 \leq z \leq 1$). For specific examples of nitride three-five compound semiconductors, GaN, InN, AlN, AlGaN, InGaN, and AlGaInN are named. For semiconductors having cubic crystal structures, AlGaInP semiconductors and AlGaAs semiconductors are named. The first conductive type may be an n-type or may be a p-type, and a second conductive type may be a p-type or an n-type, correspondingly.

For methods of growing the first semiconductor layer, the light emitting layer and the second semiconductor layer, for example, various epitaxial growth methods such as organic metal chemical vapor deposition (MOCVD), hydride vapor epitaxial growth or halide vapor epitaxial growth (HVPE), and molecular beam epitaxy (MBE) may be used, which are not restricted thereto. For the substrate used for growth, basically any substrates having any materials may be used as long as the first semiconductor layer, the light emitting layer and the second semiconductor layer can be grown with excellent crystallizability. More specifically, for example, in the case in which the first semiconductor layer, the light emitting layer and the second semiconductor layer are formed of nitride three-five compound semiconductors, such substrates may be used that are formed of sapphire ($Al_2O_3$) (C plane, A plane, R plane are included, and planes that are off from these planes are also included), SiC (6H, 4H, 3C are included), nitride three-five compound semiconductors (GaN, InAlGaN, AlN and others), Si, ZnS, ZnO, LiMgO, GaAs, or $MgAl_2O_4$. In addition, for example, in the case in which the first semiconductor layer, the light emitting layer and the second semiconductor layer are formed of AlGaInP semiconductors or AlGaAs semiconductors, typically, a GaAs substrate may be used.

A substrate for mounting a light emitting device according to an embodiment is a substrate for mounting a light emitting device including: a light emitting device having an electrode on a light emission surface, the light emitting device being mounted on the substrate, wherein the electrode is formed nearly in a linear shape in which the width is narrower than the light emission surface, and a wiring that is connected to the electrode is formed nearly in a linear shape in which the width is narrower than the light emission surface to cross the electrode.

Here, typically, the light emitting device may be mounted on the substrate as the light emitting surface is upward.

In the substrate for mounting a light emitting device according to an embodiment, for the descriptions other than the descriptions above, the discussions for the method according to an embodiment are held as long as not deviating from the nature.

A display according to an embodiment is a display including: a substrate for mounting a light emitting device in which a light emitting device having an electrode on a light emission surface is mounted on a substrate, wherein the electrode is formed nearly in a linear shape in which the width is narrower than the light emission surface, and a wiring that is connected to the electrode is formed nearly in a linear shape in which the width is narrower than the light emission surface to cross the electrode.

Typically, the display is a light emitting diode display using a light emitting diode as a light emitting device, which is not restricted thereto. Typically, the light emitting diode display has a plurality of light emitting diodes that emits red light, a plurality of light emitting diodes that emits green light and a plurality of light emitting diodes that emits blue light arranged on a circuit board, in which among a plurality of light emitting diodes that emits red light, a plurality of light emitting diodes that emits green light and a plurality of light emitting diodes that emits blue light, in at least one of the light emitting diodes, the electrode on the light emission surface is formed nearly in a linear shape in which the width is narrower than the light emission surface, and the wiring that connected to the electrode is formed nearly in a linear shape in which the width is narrower than the light emission surface to cross the electrode.

A back light according to an embodiment is a back light including: a substrate for mounting a light emitting device in which a light emitting device having an electrode on a light emission surface is mounted on a substrate, wherein the electrode is formed nearly in a linear shape in which the width is narrower than the light emission surface, and a wiring that is connected to the electrode is formed nearly in a linear shape in which the width is narrower than the light emission surface to cross the electrode.

Typically, the back light is a light emitting diode back light using a light emitting diode as a light emitting device, which is not restricted thereto. Typically, the light emitting diode back light has a plurality of light emitting diodes that emits red light, a plurality of light emitting diodes that emits green light and a plurality of light emitting diodes that emits blue light arranged on a circuit board, in which among a plurality of light emitting diodes that emits red light, a plurality of light emitting diodes that emits green light and a plurality of light emitting diodes that emits blue light, in at least one of the light emitting diodes, the electrode on the light emission surface is formed nearly in a linear shape in which the width is narrower than the light emission surface, and the wiring that connected to the electrode is formed nearly in a linear shape in which the width is narrower than the light emission surface to cross the electrode.

An illuminating apparatus according to an embodiment is an illuminating apparatus including: a substrate for mounting a light emitting device in which a light emitting device having an electrode on a light emission surface is mounted on a substrate, wherein the electrode is formed nearly in a linear shape in which the width is narrower than the light emission surface, and a wiring that is connected to the electrode is formed nearly in a linear shape in which the width is narrower than the light emission surface to cross the electrode.

Typically, the illuminating apparatus is a light emitting diode illuminating apparatus using a light emitting diode as a light emitting device, which is not restricted thereto. Typically, the light emitting diode illuminating apparatus has a plurality of light emitting diodes that emits red light, a plurality of light emitting diodes that emits green light and a plurality of light emitting diodes that emits blue light arranged on a circuit board, in which among a plurality of light emitting diodes that emits red light, a plurality of light emitting diodes that emits green light and a plurality of light emitting diodes that emits blue light, in at least one of the light emitting diodes, the electrode on the light emission surface is formed nearly in a linear shape in which the width is narrower than the light emission surface, and the wiring that connected to the electrode is formed nearly in a linear shape in which the width is narrower than the light emission surface to cross the electrode.

In the display, the back light, and the illuminating apparatus according to an embodiment, for the light emitting diode that emits red light, the light emitting diode that emits green light and the light emitting diode that emits blue light, for example, those using nitride three-five compound semiconductors may be used. For the light emitting diode that emits red light, for example, a light emitting diode that uses AlGaInP semiconductors may be used.

An electronic appliance according to an embodiment is an electronic appliance including: a substrate for mounting a light emitting device in which a light emitting device having an electrode on a light emission surface is mounted on a substrate, wherein the electrode is formed nearly in a linear shape in which the width is narrower than the light emission surface, and a wiring that is connected to the electrode is formed nearly in a linear shape in which the width is narrower than the light emission surface to cross the electrode.

The electronic appliance may be basically any electronic appliances as long as those having at least one of light emitting diodes for the purpose of the back light, the display, the illuminating apparatus and others for a liquid crystal display device, including portable ones and stationary ones. Specific examples are a cellular telephone, a mobile device, a robot, a personal computer, a device for cars, and various home appliances.

In the display, the back light, the illuminating apparatus, and the electronic appliance according to an embodiment, for the descriptions other than the descriptions above, the discussions for the method according to an embodiment are held as long as not deviating from the nature.

In an embodiment configured as described above, the electrode on the light emission surface is formed nearly in a linear shape in which the width is narrower than the light emission surface, and the wiring that is connected to the electrode is formed nearly in a linear shape in which the width is narrower than the light emission surface to cross the electrode. Therefore, it is sufficient that the wiring is connected to any portions of the electrode in a linear shape in the longitudinal direction and at any portions of the wiring in the longitudinal direction, which provides a great margin to the position shift of the light emitting device in mounting the light emitting device on the substrate and the position shift of the wiring in forming the wiring.

In addition, in the case in which as the light emitting device, such a light emitting device is used that has an end surface in which the semiconductor layer forming the structure of the light emitting diode is tilted at an angle $\theta_1$ to the main plane and has a reflector outside the end surface, the reflector at least partially including a portion that is faced to the end surface and tilted to the main plane at an angle $\theta_2$ smaller than the angle $\theta_1$, the light generated in the semiconductor layer (the light emitting layer) in operation is emitted from the end surface tilted to the main plane of the semiconductor layer, and reflected in the reflector disposed outside the end surface toward the light emission surface side, and consequently, the ratio of taking out the light externally can be increased.

According to an embodiment, even though the position of a light emitting device is shifted in mounting the light emitting device on a substrate and the position of a wiring is shifted in forming the wiring, the electrode on the light emission surface and the wiring can be reliably connected to each other. Therefore, a substrate for mounting a light emitting device can be fabricated with increased yields, and the substrate for mounting a light emitting device can be used to implement a display, a back light, an illuminating apparatus and an electronic appliance with high performance.

Particularly, as the light emitting device, such a light emitting device is used that has an end surface in which the semiconductor layer forming the structure of the light emitting diode is tilted at an angle $\theta_1$ to the main plane and has a reflector outside the end surface, the reflector at least partially including a portion that is faced to the end surface and tilted to the main plane at an angle $\theta_2$ smaller than the angle $\theta_1$, the efficiency of taking out light can be intended significantly, the luminous efficiency can be intended greatly, and miniaturization can be made easily. Then, the micro light emitting diode with high luminous efficiency is used to implement a light emitting diode display, a light emitting diode back light, a light emitting diode illuminating apparatus, and various electronic appliances with high performance.

Additional features and advantages are described herein, and will be apparent from, the following Detailed Description and the figures.

DETAILED DESCRIPTION

Below in greater detail according to an embodiment of the present application will be described with reference to the drawings.

First, a first embodiment will be described. In the first embodiment, the case in which a light emitting diode is mounted on a substrate will be described.

Figure 1A:
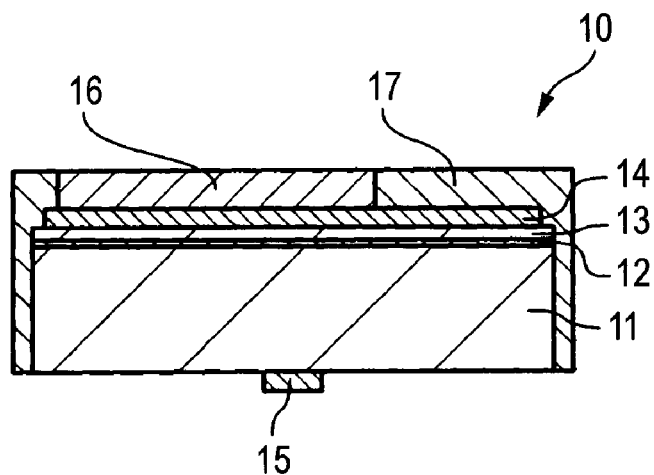
FIGS. 1A and 1B show a cross section and a bottom view depicting a light emitting diode according to a first embodiment.
Figure 1B:
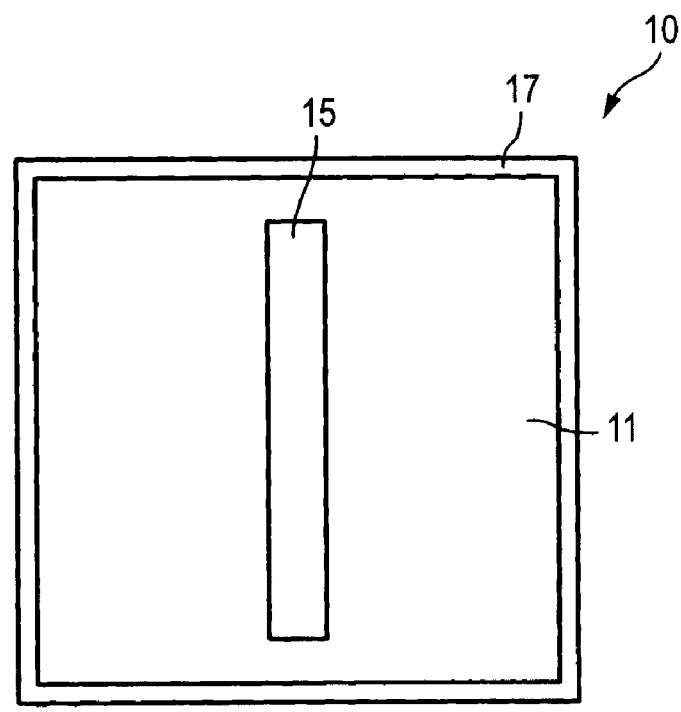

FIGS. 1A and 1B show a light emitting diode to be mounted on a substrate in the first embodiment. Here, FIGS. 1A and 1B show a cross section and a bottom view, respectively.

As shown in FIGS. 1A and 1B, in a light emitting diode 10, the structure of a light emitting diode is formed of an n-type semiconductor layer 11, a light emitting layer 12 and a p-type semiconductor layer 13, in which a p-side electrode 14 is formed on the p-type semiconductor layer 13, and an n-side electrode 15 is formed at the center of the back side of the n-type semiconductor layer 11 that is the light emission surface. In this case, the light emission surface has a square shape, which is not restricted thereto. The n-side electrode 15 has a linear shape in which the width is narrower enough than the length of one side of the light emission surface, that is, it has an elongated rectangular shape. The longitudinal direction of the n-side electrode 15 is in parallel with one side of the light emission surface, the width in the longitudinal direction is slightly shorter than the length of one side of the light emission surface. On the p-side electrode 14, a connecting conductive material 16 is formed which is formed of an Au or solder bump. A protective insulating resin 17 is formed so as to cover the surfaces except the light emission surface and the connecting conductive material 16 in the light emitting diode 10.

Figure 2A:
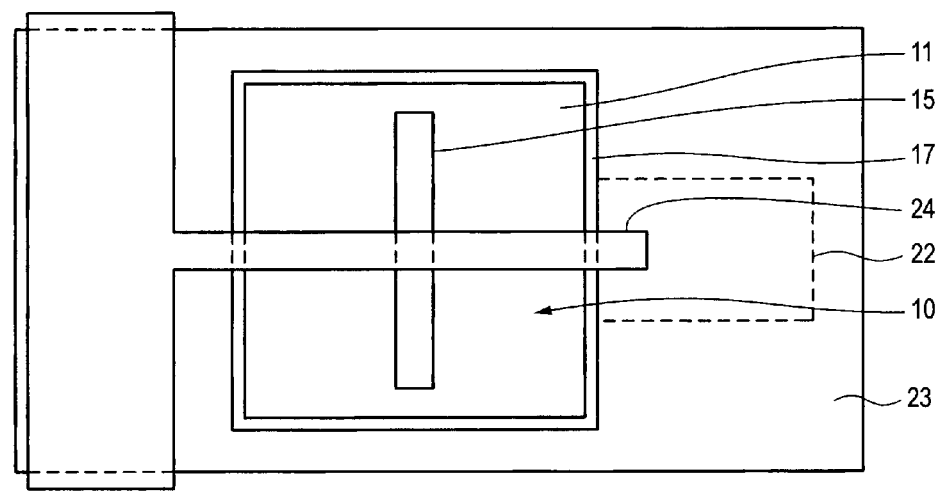
FIGS. 2A and 2B show a plan view and a cross section depicting a substrate for mounting the light emitting diode according to the first embodiment.
Figure 2B:
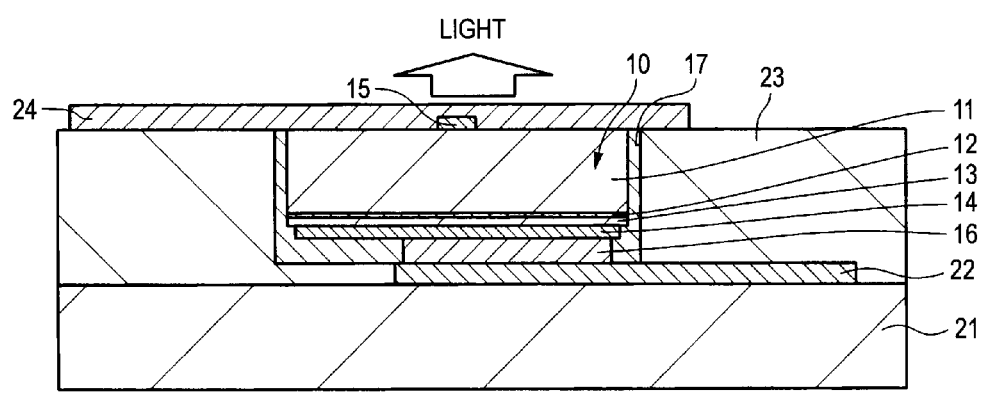

FIGS. 2A and 2B shows a substrate for mounting the light emitting diode on which the light emitting diode 10 is mounted on the substrate. Here, FIGS. 2A and 2B show a plan view and a cross section, respectively. As shown in FIGS. 2A and 2B, in this case, the connecting conductive material 16 is turned down, and the light emitting diode 10 is mounted on a wiring 22 which is formed in advance on a substrate 21 such as a glass substrate. An insulating resin 23 is buried so that the light emission surface is exposed around the light emitting diode 10, a wiring 24 in a linear shape is formed on the insulating resin 23 so as to orthogonally cross the n-side electrode 15 in a linear shape at the center part of the n-side electrode 15, and it is connected to the n-side electrode 15. The wiring 24 is formed in which it completely, longitudinally crosses the light emission surface and orthogonally crosses one side of the light emission surface. The width of the wiring 24 is formed smaller enough than the length of one side of the light emission surface. The wiring 24 is extended in the direction orthogonal to the direction of extending on the light emission surface on the insulating resin 23 outside the light emission surface. The width of the portion of the wiring 24 extended in the orthogonal direction is greater enough than the width of the portion of the wiring 24 on the light emission surface. For example, the wirings 22 and 24 are formed of Al or Au. Although FIGS. 2A and 2B show only one light emitting diode 10, the light emitting diode 10 is mounted in a predetermined arrangement by a necessary type and a necessary number of light emitting diodes depending on the use and the function of the substrate for mounting the light emitting diode.

Figure 18A:
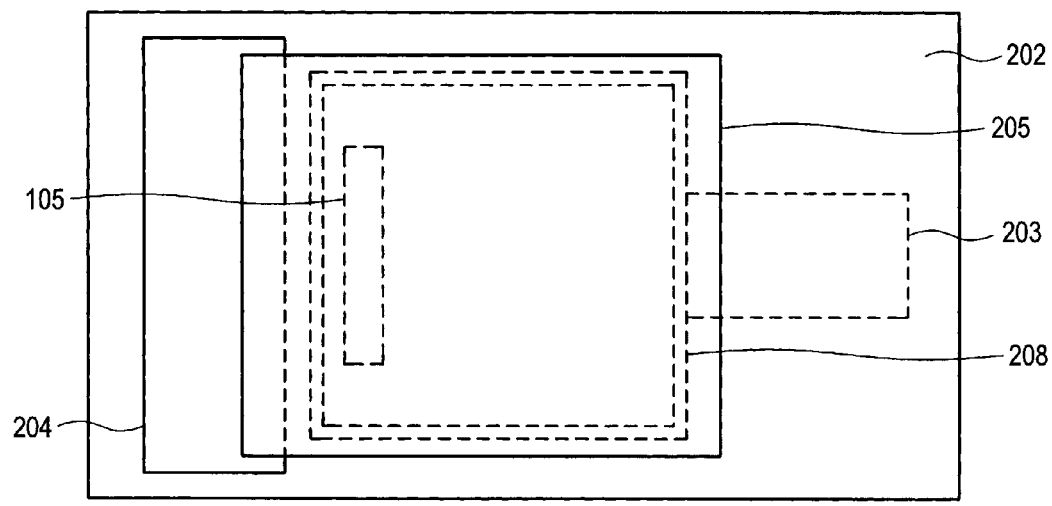
FIGS. 18A and 18B show a plan view and a cross section depicting another exemplary substrate for mounting a light emitting diode.
Figure 18B:
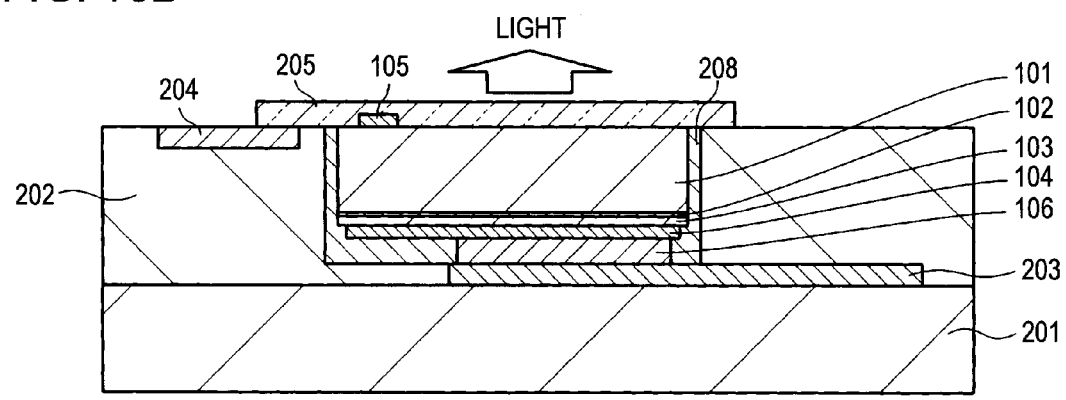

For specific examples of the size of the light emission surface, the size of the n-side electrode 15 and the width of the wiring 24 which longitudinally crosses the light emission surface, the light emission surface is a square having one side of 20 μm, the size of the n-side electrode 15 is 3×16 μm$^2$, and the width of the wiring 24 is 3 μm. In this case, the contact area of the n-side electrode 15 is 48 μm$^2$. The transmittance of the light emission surface is [20×20−(3×16+3×13)]/(20×20)= (400−99)/400=0.753=75.3%. As described above, the width of the wiring 24 is formed narrow enough, whereby a light emitting diode 10 having greater brightness can be obtained as compared with that of the light emitting diode in which the transparent electrode 205 is formed so as to cover the entire light emission surface as shown in FIGS. 18A and 18B.

Semiconductors used for the n-type semiconductor layer 11, the light emitting layer 12 and the p-type semiconductor layer 13 are selected as necessary, and more specifically, they are, for example, GaN semiconductors, AlGaInP semiconductors and others.

For example, in the case in which the light emitting diode 10 is a GaN light emitting diode, specific examples of the dimensions and materials are as follows. The n-type semiconductor layer 11 is an n-type GaN layer and the thickness is 2600 nm, for example, and the thickness of the light emitting layer 42 is 200 nm, for example, and the p-type semiconductor layer 13 is a p-type GaN layer and the thickness is 200 nm, for example. For instance, the light emitting layer 12 has a multiple quantum well (MQW) structure formed of an InGaN well layer and a GaN barrier layer, and the In composition of the InGaN well layer is 0.17, for example, in the case in which the GaN light emitting diode emits blue light, whereas it is 0.25, for example, in the case in which it emits green light. For example, the p-side electrode 14 is formed of a metal multilayer film in an Ag/Pt/Au structure, in which the thickness of the Ag film is 50 nm, for example, the thickness of the Pt film is 50 nm, for example, and the thickness of the Au film is 2000 nm, for example. The p-side electrode 14 may be formed of a single layer film of Ag. For example, the n-side electrode 15 is formed of a metal laminated film in a Ti/Pt/Au structure, in which the thicknesses of the Ti film and the Pt film are 50 nm, for example, and the thickness of the Au film is 2000 nm, for example.

For instance, in the case in which the light emitting diode 10 is an AlGaInP light emitting diode, specific examples of the dimensions and materials are as follows. The n-type semiconductor layer 11 is an n-type GaAs layer and an n-type AlGaInP layer thereon, in which the n-type GaAs layer is formed only at the center part of the n-type AlGaInP layer, the thickness of the n-type GaAs layer is 50 nm, for example, and the thickness of the n-type AlGaInP layer is 1000 nm, for example. The thickness of the light emitting layer 12 is 900 nm, for example. The p-type semiconductor layer 13 is a p-type AlGaInP layer and a p-type GaAs layer thereon, in which the p-type GaAs layer is formed only at the center part of the p-type AlGaInP layer, the thickness of the p-type AlGaInP layer is 1000 nm, for example, and the thickness of the p-type GaAs layer is 50 nm, for example. For instance, the compositions of the n-type AlGaInP layer and the p-type AlGaInP layer are Al=0 to 0.7, where Al+Ga=1, in the case in which the total of the compositions of Al and Ga is almost equal to the composition of In. For example, the light emitting layer 12 has an MQW structure formed of a $Ga_{0.5}In_{0.5}P$ well layer and an $(Al_{0.5}Ga_{0.5})_{0.5}In_{0.5}P$ barrier layer. For example, the p-side electrode 14 is formed of a metal multilayer film in an Au/Pt/Au structure, in which the thickness of the Au film is 50 nm, for example, and the thickness of the Pt film is 50 nm, for example, and the thickness of the Au film is 2000 nm, for example. For instance, the n-side electrode 15 is formed of a metal laminated film in a Pd/AuGe/Au structure, in which the thickness of the Pd film is 10 nm, for example, the thickness of the AuGe film is 90 nm, for example, and the thickness of the Au film is 2000 nm, for example.

Figure 3:
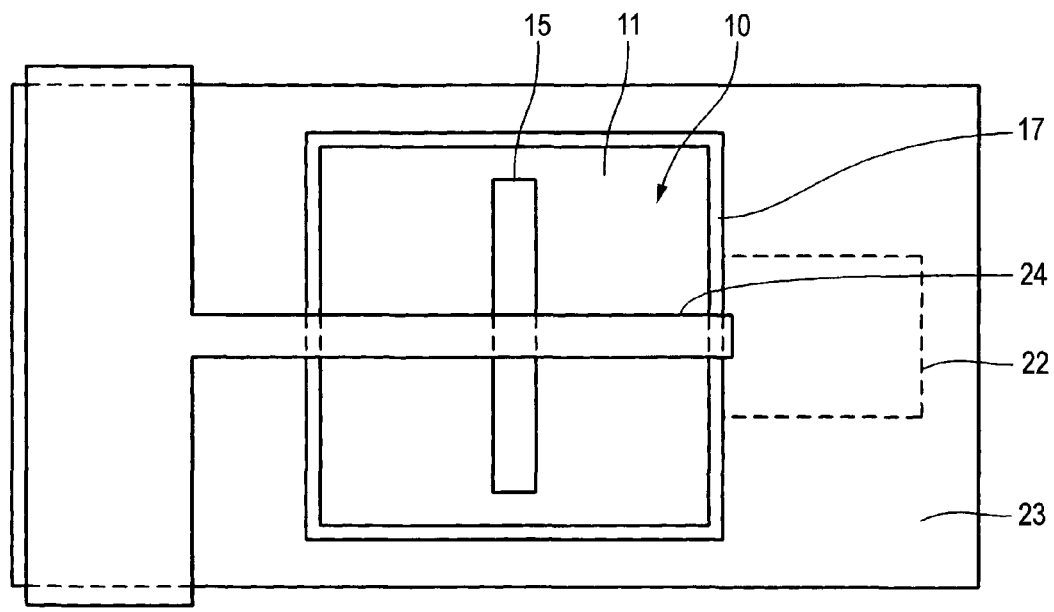
FIG. 3 shows a plan view depicting the case in which the position shift of the wiring occurs on the substrate for mounting the light emitting diode according to the first embodiment.
Figure 4:
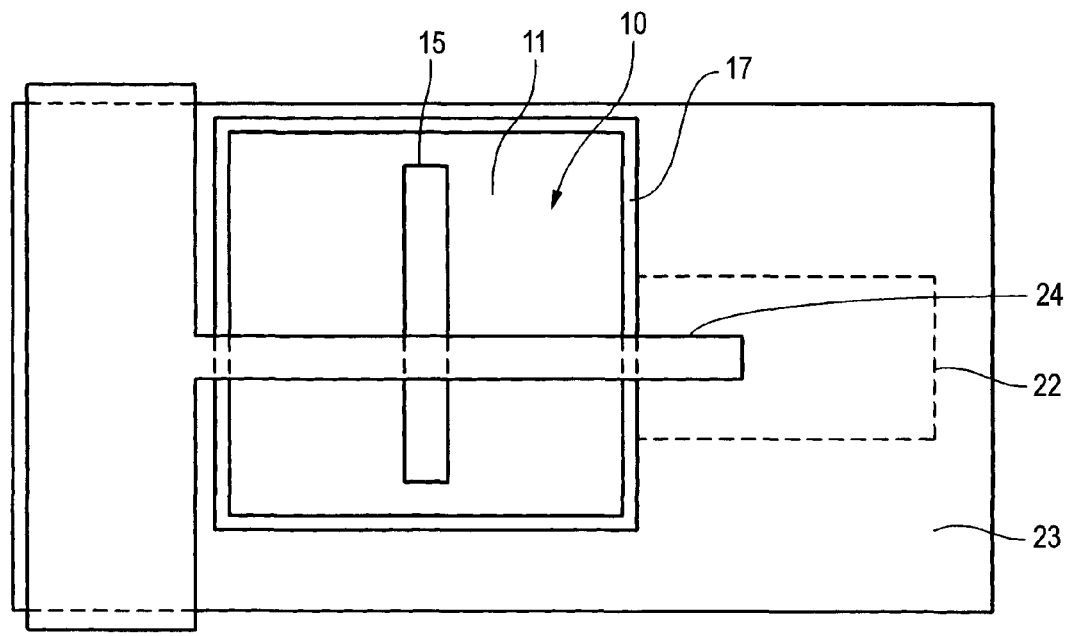
FIG. 4 shows a plan view depicting the case in which the position shift of the light emitting diode occurs on the substrate for mounting the light emitting diode according to the first embodiment.

According to the first embodiment, the n-side electrode 15 on the light emission surface is formed nearly in a linear shape in which the width is narrower than the light emission surface, and the wiring 24 which is connected to the n-side electrode 15 is formed nearly in a linear shape in which the width is narrower than the light emission surface, and it orthogonally crosses the n-side electrode 15. Thus, it is sufficient that the wiring 24 is connected at any portions of the n-side electrode 15 in a linear shape in the longitudinal direction as well as at any portions of the wiring 24 in the longitudinal direction, which provides a great margin to the position shift in mounting the light emitting diode 10 on the substrate 21 and the position shift in forming the wiring 24. Therefore, even though a position shift occurs in mounting the light emitting diode 10 on the substrate 21, or a position shift occurs in forming the wiring 24, the n-side electrode 15 on the light emission surface can be reliably connected to the wiring 24. For example, as shown in FIG. 3 or FIG. 4, even though the position at which the light emitting diode 10 is mounted is shifted in the longitudinal direction of the wiring 24 or in the direction orthogonal to the longitudinal direction, the n-side electrode 15 can be reliably connected to the wiring 24. Therefore, the substrate for mounting the light emitting diode can be fabricated with increased yields, and a reduction in fabrication costs can be intended. In addition, in this case, since the space of the light blocking area caused by the n-side electrode 15 and the wiring 24 on the light emission surface is not changed, the brightness of the light emitting diode 10 is rarely varied.

Next, a second embodiment will be described.

Figure 5:
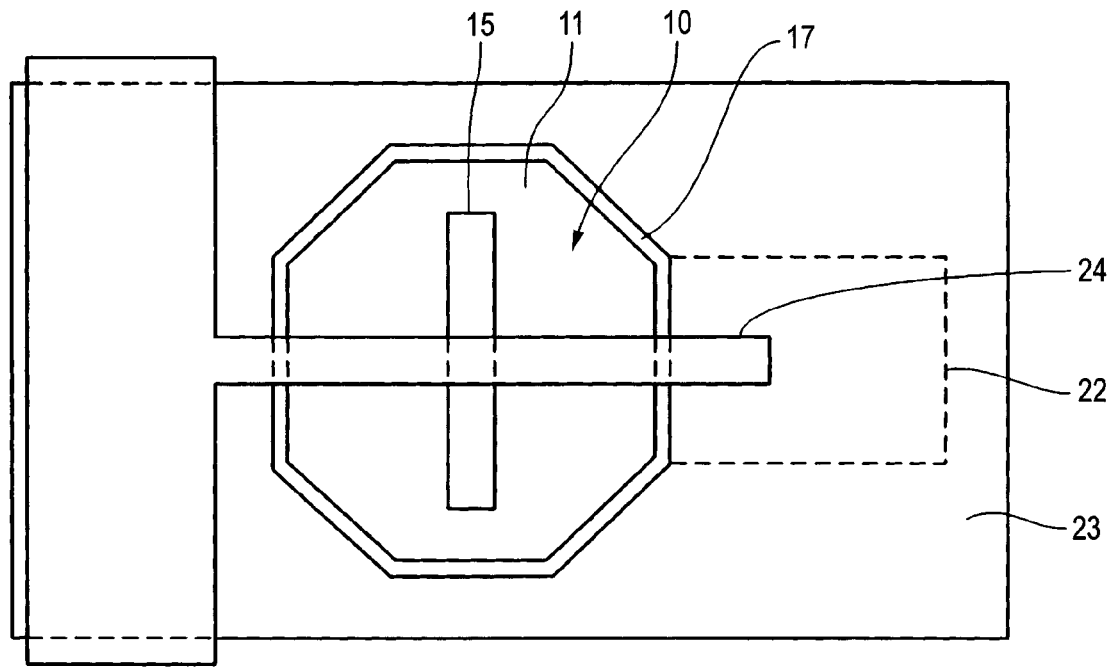
FIG. 5 shows a plan view depicting a substrate for mounting a light emitting diode according to a second embodiment.

As shown in FIG. 5, the second embodiment is similar to the first embodiment except that the shape of the light emission surface of a light emitting diode 10 to be mounted on a substrate 21 has an octagon.

According to the second embodiment, the similar advantages as those of the first embodiment can be obtained.

Next, a third embodiment will be described.

Figure 6:
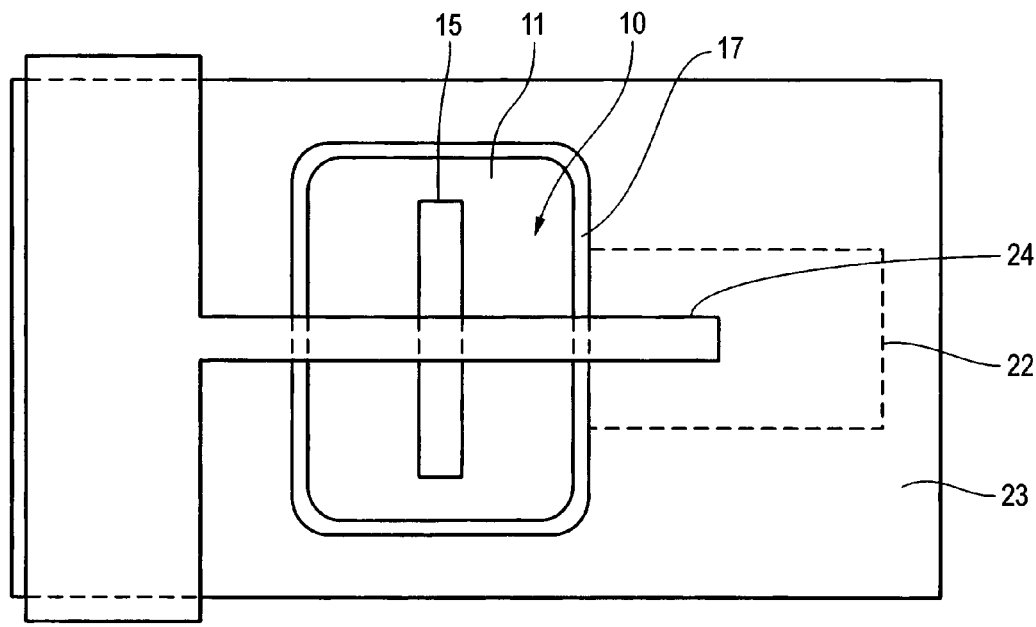
FIG. 6 shows a plan view depicting a substrate for mounting a light emitting diode according to a third embodiment.

As shown in FIG. 6, the third embodiment is similar to the first embodiment except that the shape of the light emission surface of a light emitting diode 10 to be mounted on a substrate 21 has a rectangular shape with round corners.

According to the third embodiment, the similar advantages as those of the first embodiment can be obtained.

Next, a fourth embodiment will be described.

Figure 7:
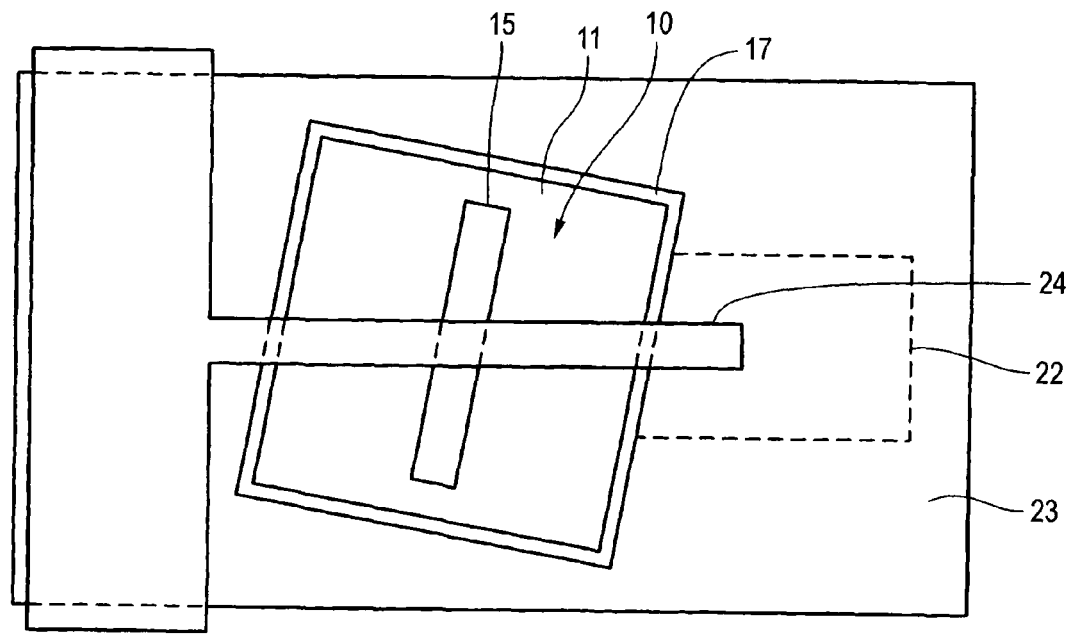
FIG. 7 shows a plan view depicting a substrate for mounting a light emitting diode according to a fourth embodiment.

As shown in FIG. 7, the fourth embodiment is similar to the first embodiment except that a light emitting diode 10 to be mounted on a substrate 21 is mounted in the state in which it is rotated about the center axis, and a wiring 24 is formed so as to obliquely cross an n-side electrode 15 and to be connected to the n-side electrode 15.

According to the fourth embodiment, the similar advantages as those of the first embodiment can be obtained.

Next, a fifth embodiment will be described.

Figure 8:
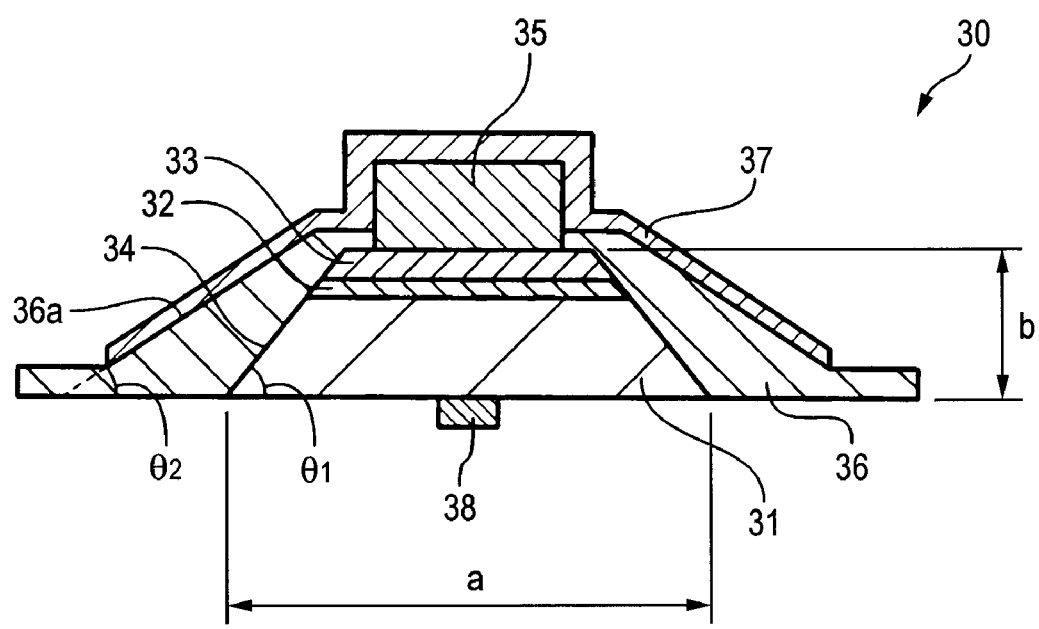
FIG. 8 shows a cross section depicting a light emitting diode according to a fifth embodiment.

The fifth embodiment is different from the first embodiment in that instead of the light emitting diode 10 shown in FIGS. 1A and 1B, a light emitting diode 30 shown in FIG. 8 is mounted on a substrate 21.

As shown in FIG. 8, in the light emitting diode 30, it is the same as the light emitting diode 10 shown in FIGS. 1A and 1B in that the structure of the light emitting diode is formed of an n-type semiconductor layer 31, a light emitting layer 32 and a p-type semiconductor layer 33. However, in this case, for example, the n-type semiconductor layer 31, the light emitting layer 32 and the p-type semiconductor layer 33 are generally have a circular flat shape, and an end surface (side surface) 34 is tilted at an angle $\theta_1$ to the under side of the n-type semiconductor layer 31. The sectional shape in the direction of the diameter of the n-type semiconductor layer 31, the light emitting layer 32 and the p-type semiconductor layer 33 is a trapezoid ($\theta_1 < 90$ degrees), a rectangle ($\theta_1 = 90$ degrees) or a reverse trapezoid ($\theta_1 > 90$ degrees), and a circular p-side electrode 35, for example, is formed on the p-type semiconductor layer 33. A transparent resin 36 is formed so as to cover the top surface of the p-type semiconductor layer 33 around the end surface 34 and the p-side electrode 35. Then, a reflective film 37 is formed so as to cover throughout the transparent resin 36 and the p-side electrode 35. On the back side of the n-type semiconductor layer 31 that is the light emission surface, an n-side electrode 38 in a linear, elongated rectangular shape is formed which is extended in the direction of the diameter of the back side.

In order to maximize the efficiency of taking out light, the structure of the light emitting diode 30 is optimized as follows:

(1) A slope 36a of the transparent resin 36 is tilted at an angle $\theta_2$ to the under side of the n-type semiconductor layer 31, and thus the reflective film 37 is also tilted at the angle $\theta_2$ to the under side of the n-type semiconductor layer 31, where $\theta_2 < \theta_1$. Therefore, the light generated from the light emitting layer 32 and emitted from the end surface 34 is reflected in the reflective film 37 and directed downward, which tends to be easily taken out to outside.

(2) A refractive index $n_2$ of the transparent resin 36 is the refractive index of air$<n_2<$n1, where the overall average refractive index of the n-type semiconductor layer 31, the light emitting layer 32 and the p-type semiconductor layer 33 is n1. Therefore, the light generated from the light emitting layer 32 and incident to the end surface 34 tends to emit outside from the end surface 34 as compared with the case in which the external medium of the end surface 34 is air, which finally tends to be easily taken out to outside.

(3) The aspect ratio b/a is within the range of 0.001 to 2, and b is within the range of 0.3 to 10 μm, where the maximum diameter of the structure of the light emitting diode, that is, the diameter of the under side of the n-type semiconductor layer 31 is a, and the overall thickness (the height) is b.

(4) For the materials of the reflective film 37, those having a high reflectance to the light of the light emitting wavelength as high as possible, such as metals having Ag or a main component of Ag, for example, are used. Therefore, the light emitted from the end surface 34 or the top surface of the p-type semiconductor layer 33 to outside can be efficiently reflected in the reflective film 37, which finally tends to be easily taken out to outside. In addition, the reflective film 37 has ohmic contact to the p-side electrode 35, and also serves as a part of the p-side electrode 35 or a part of the wiring to be connected to the p-side electrode 35, whereby it is intended to reduce the resistance of the p-side electrode 35, and to drop operating voltage.

Figure 9:
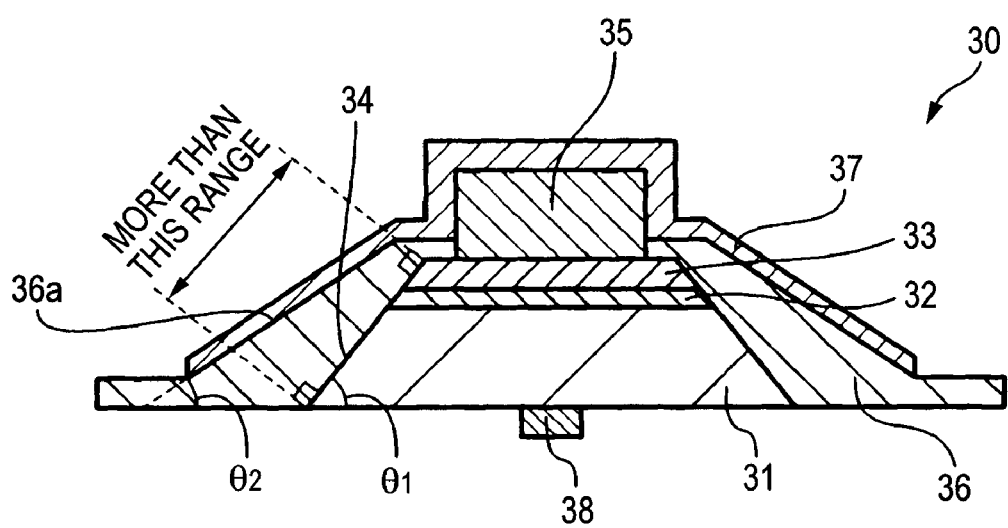
FIG. 9 shows a cross section illustrative of the light emitting diode according to the fifth embodiment.

(5) As shown in FIG. 9, the reflective film 37 is formed in such ways that it at least includes an area in which the end surface 34 is projected onto the slope 36a of the transparent resin 36 in the direction orthogonal to the end surface 34 where 30 degrees$\leq \theta_1 \leq$90 degrees, whereas it at least includes an area in which the end surface 34 is projected onto the slope 36a in the direction in which the direction orthogonal to the end surface 34 is returned in the surface to take out light, that is, on the under side of the n-type semiconductor layer 31 where 90 degrees$<\theta_1 \leq$150 degrees. Therefore, almost all of the light generated from the light emitting layer 32 and emitted from the end surface 34 is reflected in the reflective film 37 and directed downward, which tends to be taken out to outside.

(6) The reflective film 37 is formed not only on the transparent resin 36 on the end surface 34 but also on the transparent resin 36 and the p-side electrode 35 on the top surface of the p-type semiconductor layer 33. Therefore, the light generated from the light emitting layer 32 and emitted from the end surface 34 as well as the light emitted from the top surface of the p-type semiconductor layer 33 are reflected in the reflective film 37 and directed downward, which tend to be taken out to outside.

(7) $\theta_1$ and $\theta_2$ are selected so as to satisfy the conditions below:

$\theta_2 \geq (\theta_1 - \sin^{-1}(n_3/n_2))/2$ and $\theta_2 \leq \theta_1/2$, where 30 degrees$\leq \theta_1 \leq$150 degrees and 30 degrees$\leq \theta_1 \leq$90 degrees; and $\theta_2 \geq ((\theta_1 - 90) - \sin^{-1}(n_3/n_2))/2$ and $\theta_2 \leq (\theta_1 - 90)/2$, where 90 degrees$< \theta_1 \leq$150 degrees.

Figure 10:
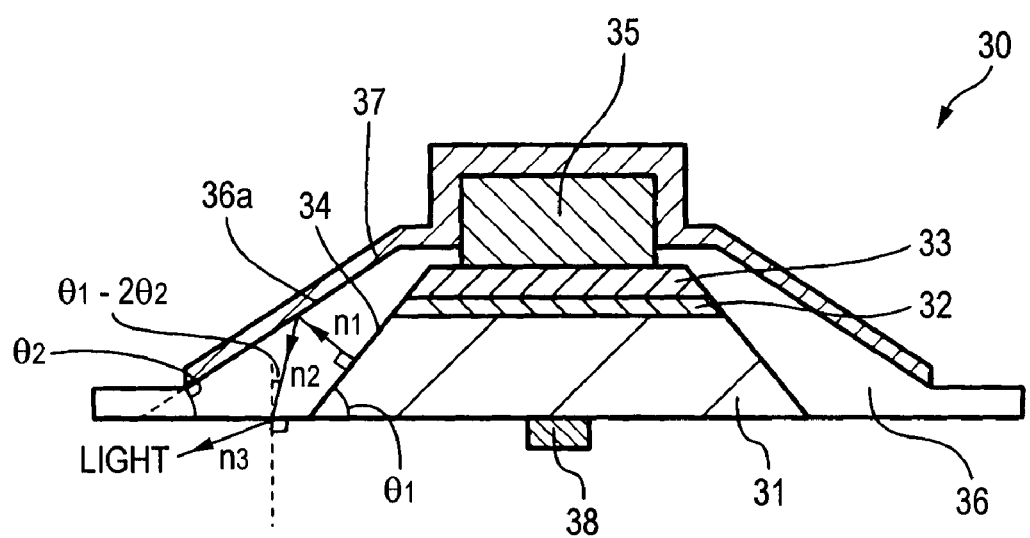
FIG. 10 shows a cross section illustrative of the light emitting diode according to the fifth embodiment.

Here, $n_3$ is the refractive index of the external medium that contacts with the under side of the transparent resin 36. In the case of $\theta_1 >$90 degrees, the light all reflected in the light emission surface enters the reflective film 37. As shown in FIG. 10, $\theta_2 \geq (\theta_1 - \sin^{-1}(n_3/n_2))/2$ or $\theta_2 \geq ((\theta_1 - 90) - \sin^{-1}(n_3/n_2))/2$ is the condition that all the light emitted from the end surface 34 in the direction orthogonal thereto is not reflected in the interface between the transparent resin 36 and the external medium. In addition, $\theta_2 \leq \theta_1/2$ or $\theta_2 \leq (\theta_1 - 90)/2$ is the condition that the light does not enter from the transparent resin 36 side to the end surface 34.

(8) In the n-side electrode 38, the portion thereof except at least the both end parts in the longitudinal direction is formed in the area in which the top surface of the p-type semiconductor layer 33 is projected onto the under side of the n-type semiconductor layer 31 in the direction orthogonal thereto. Thus, the following advantage can be obtained. In other words, in the GaN light emitting diode, almost all of the light generated from the light emitting layer 32, reflected in the end surface 34, directed downward and taken out to outside is concentrated in the area in which the end surface 34 is projected onto the under side of the n-type semiconductor layer 31. The n-side electrode 38 is formed in this area, and then the n-side electrode 38 blocks the light to be taken out to outside to loss light quantity. Thus, preferably, the n-side electrode 38 is formed in another area avoiding this area as much as possible, that is, it is formed in the area in which the top surface of the p-type semiconductor layer 33 is projected onto the under side of the n-type semiconductor layer 31 in the direction orthogonal thereto.

Semiconductors used for the n-type semiconductor layer 31, the light emitting layer 32 and the p-type semiconductor layer 33 are selected as necessary. More specifically, for example, they are GaN semiconductors, and AlGaInP semiconductors.

For example, in the case in which the light emitting diode 30 is a GaN light emitting diode, specific examples of the dimensions and materials are as follows. The n-type semiconductor layer 31 is an n-type GaN layer, the thickness is 2600 nm, for example, the thickness of the light emitting layer 32 is 200 nm, for example, the p-type semiconductor layer 33 is a p-type GaN layer, and the thickness is 200 nm, for example. For instance, the light emitting layer 32 has an MQW structure formed of an InGaN well layer and a GaN barrier layer, in which the In composition of the InGaN well layer is 0.17, for example, in the case in which the GaN light emitting diode emits blue light, whereas it is 0.25, for example, in the case in which it emits green light. For example, a is 20 μm, where the maximum diameter of the structure of the light emitting diode, that is, the diameter of the under side of the n-type semiconductor layer 31 is a. As described above, in the case in which the thickness of the n-type GaN layer as the n-type semiconductor layer 31 is 2600 nm and the thicknesses of the light emitting layer 32 and the p-type semiconductor layer 33 as the p-type GaN layer are 200 nm each, the overall thickness of the structure of the light emitting diode is 2600+200+ 200=3000 nm=3 µm. In this case, the aspect ratio of the structure of the light emitting diode is b/a=3/20=0.15, where the overall thickness of the structure of the light emitting diode (the height) is b. For example, $\theta_1$ is 50 degrees. For example, the p-side electrode 35 is formed of a metal multilayer film in an Ag/Pt/Au structure, in which the thickness of the Ag film is 50 nm, for example, the thickness of the Pt film is 50 nm, for example, and the thickness of the Au film is 2000 nm, for example. The p-side electrode 35 may be a single layer film of Ag. For instance, the n-side electrode 38 is formed of a metal laminated film in a Ti/Pt/Au structure, in which the thicknesses of the Ti film and the Pt film are 50 nm each, for example, and the thickness of the Au film is 2000 nm, for example.

For example, in the case in which the light emitting diode 30 is an AlGaInP light emitting diode, specific examples of the dimensions and materials are as follows. The n-type semiconductor layer 31 is formed of an n-type GaAs layer and an n-type AlGaInP layer thereon, in which the n-type GaAs layer is formed only at the center part of the n-type AlGaInP layer, the thickness of the n-type GaAs layer is 50 nm, for example, and the thickness of the n-type AlGaInP layer is 1000 nm, for example. The thickness of the light emitting layer 32 is 900 nm, for example. The p-type semiconductor layer 33 is formed of a p-type AlGaInP layer and a p-type GaAs layer thereon, in which the p-type GaAs layer is formed only at the center part of the p-type AlGaInP layer, the thickness of the p-type AlGaInP layer is 1000 nm, for example, and the thickness of the p-type GaAs layer is 50 nm, for example. The composition of the n-type AlGaInP layer and the p-type AlGaInP layer is Al=0 to 0.7, where Al+Ga=1, for example, in which the total composition of Al and Ga is nearly equal to the composition of In. For example, the light emitting layer 32 has an MQW structure formed of a $Ga_{0.5}In_{0.5}P$ well layer and an $(Al_{0.5}Ga_{0.5})_{0.5}In_{0.5}P$ barrier layer. The maximum diameter a of the structure of the light emitting diode is 20 µm, for example. As described above, in the case in which the thickness of the n-type GaAs layer is 50 nm, the thickness of the n-type AlGaInP layer is 1000 nm, the thickness of the light emitting layer 32 is 900 nm, the thickness of the p-type AlGaInP layer is 1000 nm, and the thickness of the p-type GaAs layer is 50 nm, the overall thickness of the structure of the light emitting diode is 50+1000+900+1000+50=3000 nm=3 µm. In this case, the aspect ratio of the structure of the light emitting diode is b/a=3/20=0.15. For example, $\theta_1$ is 45 degrees. For example, in the case in which the refractive index of the transparent resin 36 is 1.6, the thickness thereof in coating is equivalent to 1 µm in the flat part and the thickness is reduced to 70% due to shrinkage on curing, $\theta_2$ is 20 degrees, for example. For instance, the p-side electrode 35 is formed of a metal multilayer film in an Au/Pt/Au structure, in which the thickness of the Au film is 50 nm, for example, the thickness of the Pt film is 50 nm, for example, and the thickness of the Au film is 2000 nm, for example. For instance, the reflective film 37 is formed of an Au single layer film, in which the thickness is 100 nm, for example. For instance, the n-side electrode 38 is formed of a metal laminated film in a Pd/AuGe/Au structure, in which the thickness of the Pd film is 10 nm, for example, the thickness of the AuGe film is 90 nm, for example, and the thickness of the Au film is 2000 nm, for example.

In the light emitting diode 30, the light generated from the light emitting layer 32 in operation is reflected in the end surface 34, and taken out to outside from the under side of the n-type semiconductor layer 31, or the light is emitted from the end surface 34 and the top surface of the p-type semiconductor layer 33, reflected in the reflective film 37, and taken out from the under side of the transparent resin 36 to outside, or directly directed to the under side of the n-type semiconductor layer 31 and taken out as it is. In this case, as described above, since each part is optimized in view of maximizing the efficiency of taking out light, the light quantity to be externally taken out of the light emitting diode 30 is significantly great.

As similar to the light emitting diode shown in FIGS. 2A and 2B, the light emitting diode 30 is mounted on a wiring 22 formed in advance on the substrate 21 as the reflective film 37 is turned down, and an insulating resin 23 is buried so that the light emission surface is exposed around the light emitting diode 30. Then, the wiring 24 in a linear shape is formed on the insulating resin 23 so as to orthogonally cross the n-side electrode 38 in a linear shape at the center part of the n-side electrode 38, and is connected to the n-side electrode 38. A connecting conductive material is formed on the reflective film 37 or the wiring 24, and the reflective film 37 and the wiring 24 are electrically connected to each other through the connecting conductive material.

For example, the light emitting diode 30 can be fabricated according to a method below. Here, suppose the case in which a GaN light emitting diode is fabricated as the light emitting diode 30.

Figure 11A:
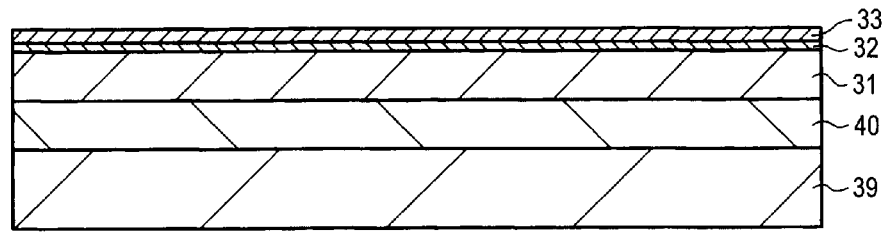
FIGS. 11A to 11C show a cross section illustrative of a method of fabricating the light emitting diode according to the fifth embodiment.

As shown in FIG. 11A, first, for example, a sapphire substrate 39 is prepared which has a thickness of 430 µm in which the main plane is C+plane, and the surface is cleaned by thermal cleaning. Then, a GaN buffer layer 40 having a thickness of 1000 nm is deposited on the sapphire substrate 39 by an MOCVD method at a low temperature of about 500° C., for example, the temperature is risen to about 1000° C. for crystallization, and the n-type semiconductor layer 31 formed of an n-type GaN layer doped with Si as an n-type impurity, the light emitting layer 32 having an MQW structure formed of an InGaN well layer and a GaN barrier layer, and the p-type semiconductor layer 33 formed of a p-type GaN layer doped with Mg as a p-type impurity are sequentially deposited. Here, for example, the n-type GaN layer is deposited at a temperature of about 1000° C., the light emitting layer 32 is deposited at a temperature of about 750° C., and the p-type GaN layer is deposited at a temperature of about 900° C. In addition, for example, the n-type GaN layer is deposited in a hydrogen gas atmosphere, the light emitting layer 32 is deposited in a nitrogen gas atmosphere, and the p-type GaN layer is deposited in a hydrogen gas atmosphere.

For example, the raw material for depositing the GaN semiconductor layer, trimethylgallium $((CH_3)_3 Ga, TMG)$ is used for a Ga raw material, trimethylaluminum $((CH_3)_3Al, TMA)$ is used for an Al raw material, trimethylindium $((CH_3)_3In, TMI)$ is used for an In raw material, and ammonia $(NH_3)$ is used for an N raw material. For the dopant, for example, silane $(SiH_4)$ is used as an n-type dopant, and bis(methylcyclopentadienyl)magnesium $((CH_3C_5H_4)_2Mg)$ or bis(cyclopentadienyl)magnesium $((C_5H_5)_2Mg)$ is used as a p-type dopant.

Subsequently, the sapphire substrate 39 on which the GaN semiconductor layer is deposited as described above is taken out of an MOCVD unit.

Figure 11B:
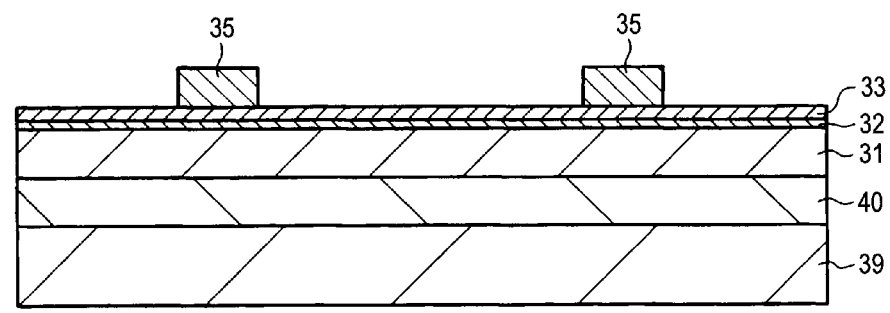

Subsequently, a resist pattern in a predetermined circular shape is formed on the surface of the substrate by lithography, an Ag film, a Pt film and an Au film are sequentially formed on throughout the surface of the substrate by sputtering, and then the resist pattern is removed together with the Ag film, the Pt film and the Au film formed thereon (lift-off). Thus, as shown in FIG. 11B, the circular p-side electrode 35 in an Ag/Pt/Au structure is formed on the p-type semiconductor layer 33 formed of the p-type GaN layer.

Figure 11C:
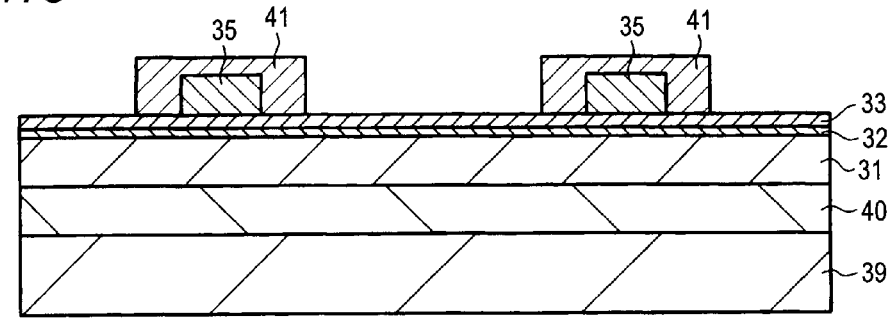

Subsequently, as shown in FIG. 11C, a circular resist pattern 41 is formed to cover the surface of a predetermined area of the p-type semiconductor layer 33 formed of the p-type GaN layer including the p-side electrode 35.

Figure 12A:
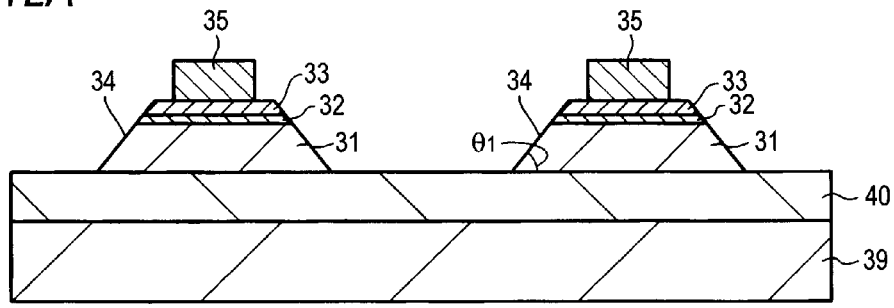
FIGS. 12A to 12C show a cross section illustrative of the method of fabricating the light emitting diode according to the fifth embodiment.

Subsequently, the resist pattern 41 is used as a mask to etch to the middle of the depth of the thickness of the n-type semiconductor layer 31 formed of the n-type GaN layer under the conditions that taper etching is performed by reactive ion etching (RIE) using a chlorine gas as an etching gas, and then the resist pattern 41 is removed. In this manner, as shown in FIG. 12A, the end surface 34 at the tilt angle $\theta_1$ is formed.

Figure 12B:
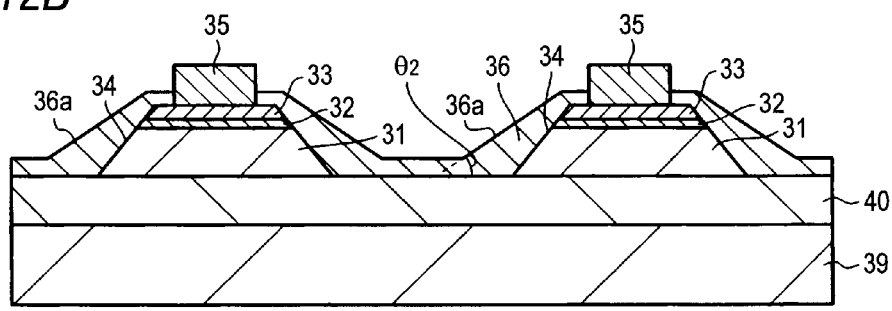

Subsequently, as shown in FIG. 12B, the transparent resin 36 is formed. For example, for the method of forming the transparent resin 36, the following method is named. In a first method, the transparent resin 36 is coated throughout the surface by spin coating to automatically set the slope 36a to the angle $\theta_2$. In a second method, the transparent resin 36 is coated by spin coating, and then the transparent resin 36 is cured and shrunk to set the slope 36a to the angle $\theta_2$. In a third method, the transparent resin 36 is formed by photolithography. More specifically, a resist (photosensitive resin) is used as the transparent resin 36, and the resist is coated, exposed and developed to set the slope 36a to the angle $\theta_2$. In a fourth method, a predetermined mold is used to press form the transparent resin 36 to set the slope 36a to the angle $\theta_2$. In a fifth method, the transparent resin 36 is thermally imprinted to set the slope 36a to the angle $\theta_2$. In a sixth method, the transparent resin 36 is formed by UV imprinting to set the slope 36a to the angle $\theta_2$. In a seventh method, the transparent resin 36 is coated by spin coating, and the transparent resin 36 is cured in the state in which the transparent resin 36 is pressed against a plastically deformable mold release layer to set the slope 36a to the angle $\theta_2$.

Figure 12C:
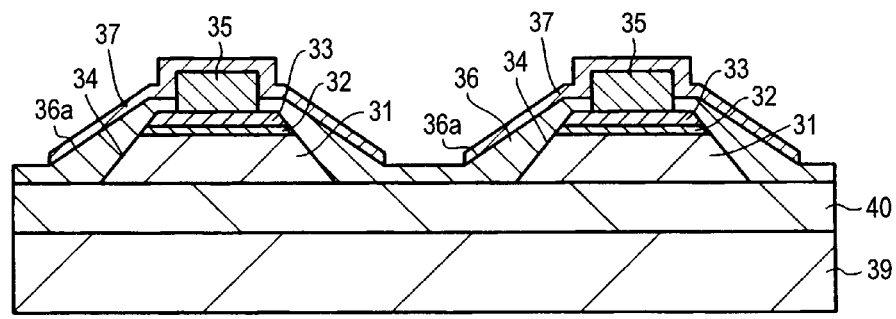

Subsequently, an Ag film and an Au film are sequentially formed throughout the substrate by sputtering, a resist pattern in a predetermined circular shape is formed by lithography, and then the resist pattern is used as a mask to etch the Ag film and the Au film. Thus, as shown in FIG. 12C, the circular reflective film 37 in an Ag/Au structure is formed on the transparent resin 36 and the p-side electrode 35.

Subsequently, the reflective film 37 side is bonded with a resin to a sapphire substrate (not shown) separately prepared, laser beams such as excimer laser are applied from the back side of the sapphire substrate 39 to apply ablation onto the interface between the sapphire substrate 39 and the n-type semiconductor layer 31 formed of an n-type GaN layer, and then the portion above the n-type semiconductor layer 31 is removed of the sapphire substrate 39. Subsequently, the GaN buffer layer 40 on the removed surface is removed by polishing it by chemical mechanical polishing (CMP), and the n-type semiconductor layer 31 is reduced in the thickness until it reaches the slope 34. At this point in time, light emitting diodes are separated from each other.

Subsequently, a resist pattern in a predetermined a linear, elongated rectangular shape is formed on the surface of the n-type semiconductor 31 by lithography, a Ti film, a Pt film and an Au film are sequentially formed throughout the surface by sputtering, and then the resist pattern is removed together with the Ti film, the Pt film and the Au film formed thereon (lift-off). Thus, the n-side electrode 38 in a Ti/Pt/Au structure in a linear, elongated shape is formed on the n-type semiconductor layer 31.

After that, the sapphire substrate on which the reflective film 37 is bonded is removed to separate the individual light emitting diodes.

As described above, as shown in FIG. 8, the target light emitting diode 30 is completed.

As described above, according to the fifth embodiment, the structure of the light emitting diode 30 is optimized, whereby the efficiency of taking out light can be maximized, and a significant improvement can be intended in luminous efficiency. In addition, the light emitting diode 30 has the structure suitable for miniaturization. For example, a super-small light emitting diode in the size of a few tens µm or below can be easily obtained.

Next, a sixth embodiment will be described. In the sixth embodiment, a light emitting diode display using the substrate for mounting the light emitting diode according to any one of the first to fifth embodiments will be described.

Figure 13:
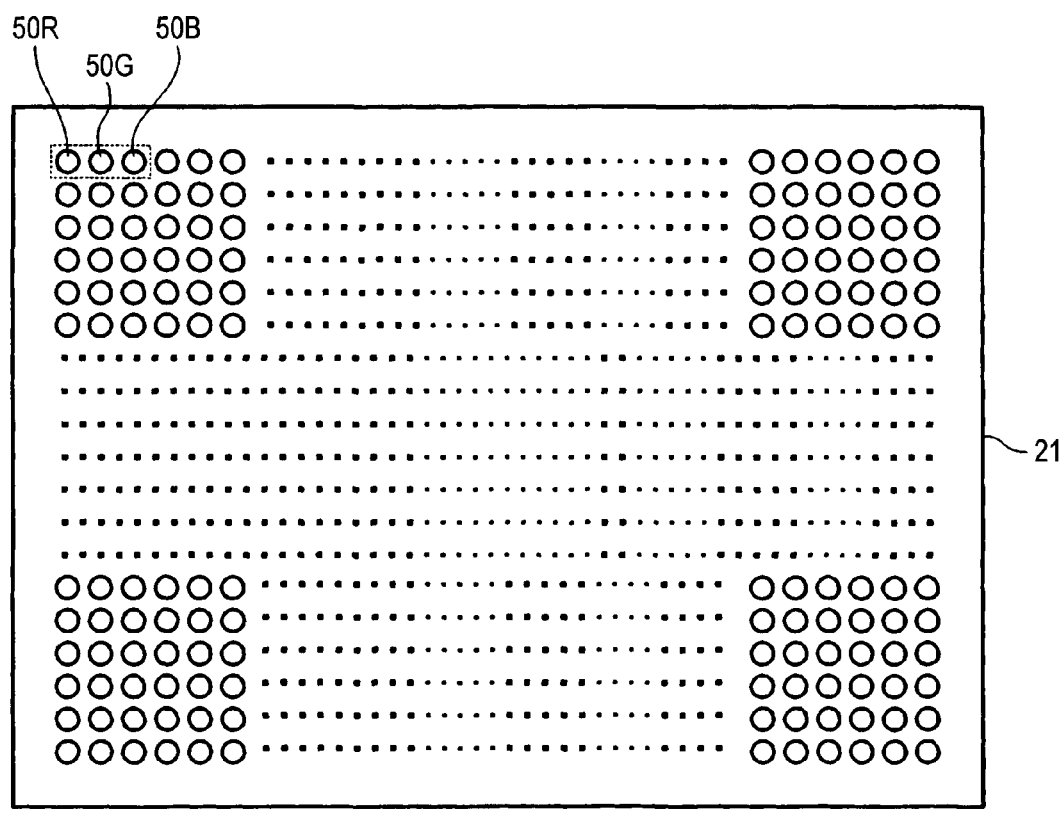
FIG. 13 shows a plan view illustrative of a light emitting diode display according to a sixth embodiment.
Figure 14A:
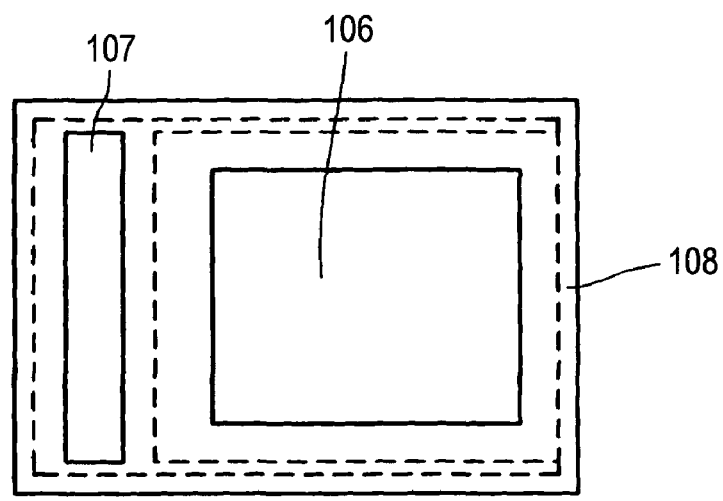
FIGS. 14A and 14B show a plan view and a cross section depicting an exemplary light emitting diode before.
Figure 14B:
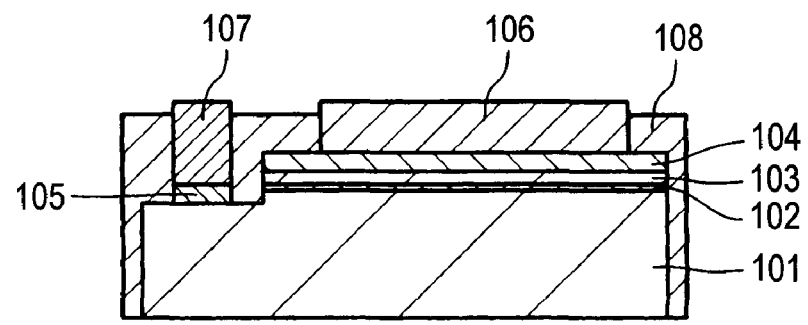
Figure 15A:
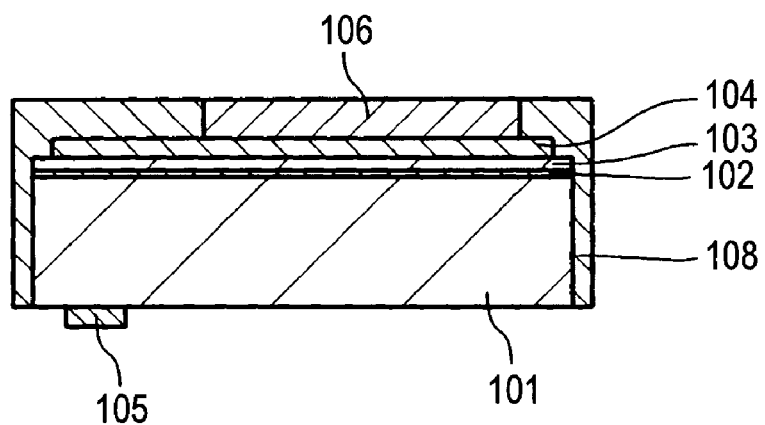
FIGS. 15A and 15B show a cross section and a bottom view depicting another exemplary light emitting diode before.
Figure 15B:
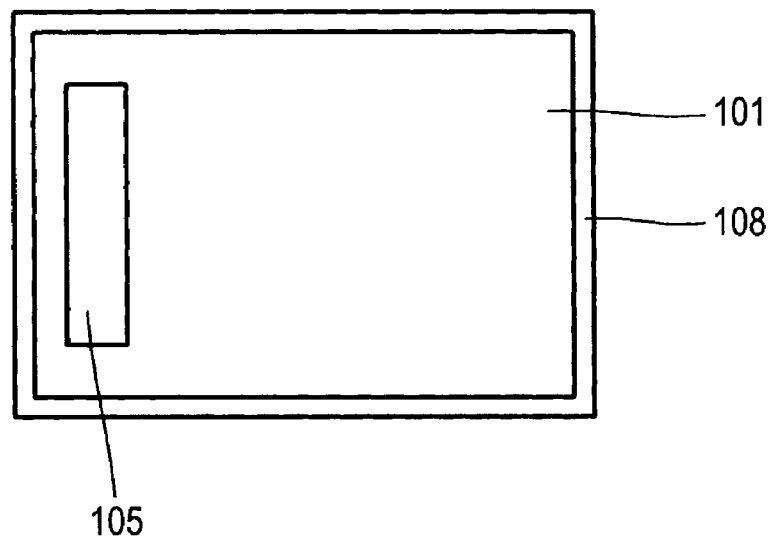
Figure 16A:
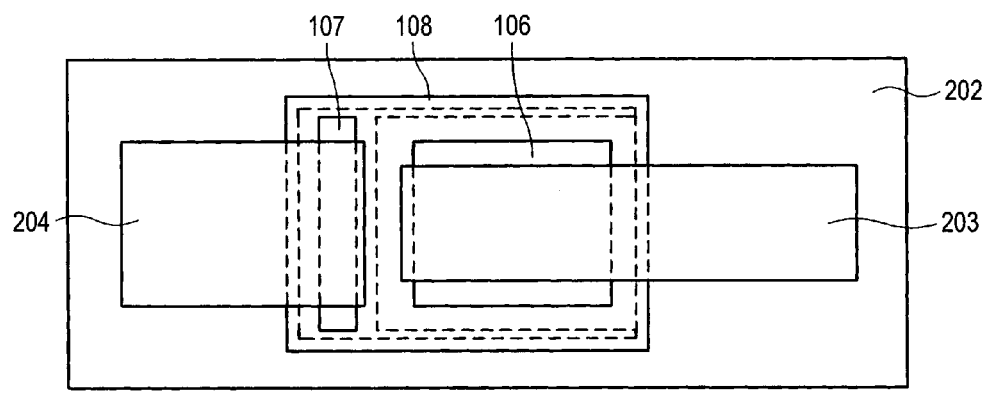
FIGS. 16A and 16B show a plan view and a cross section depicting a substrate for mounting a light emitting diode on which the light emitting diode before shown in FIGS. 14A and 14B is mounted.
Figure 16B:
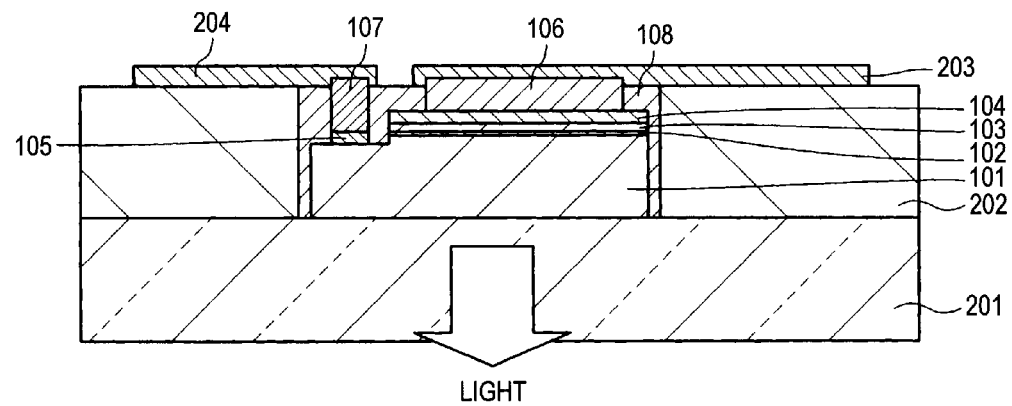
Figure 17A:
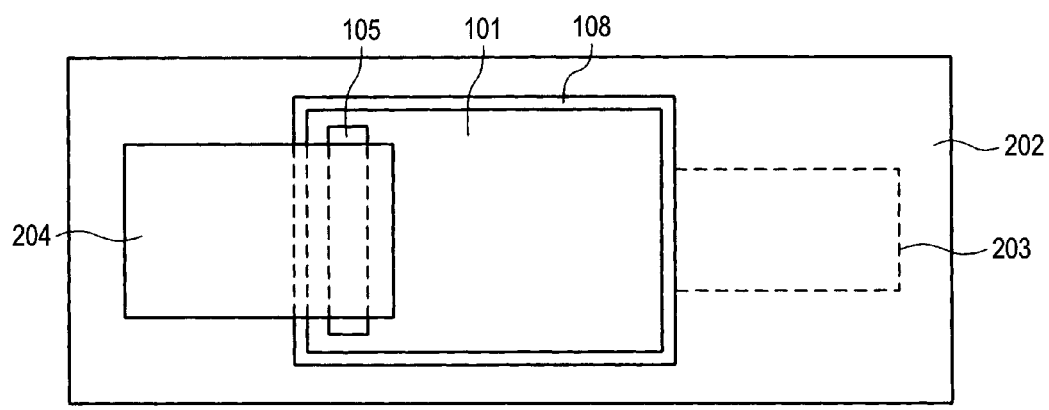
FIGS. 17A and 17B show a plan view and a cross section depicting a substrate for mounting a light emitting diode on which the light emitting diode before shown in FIGS. 15A and 15B is mounted.
Figure 17B:
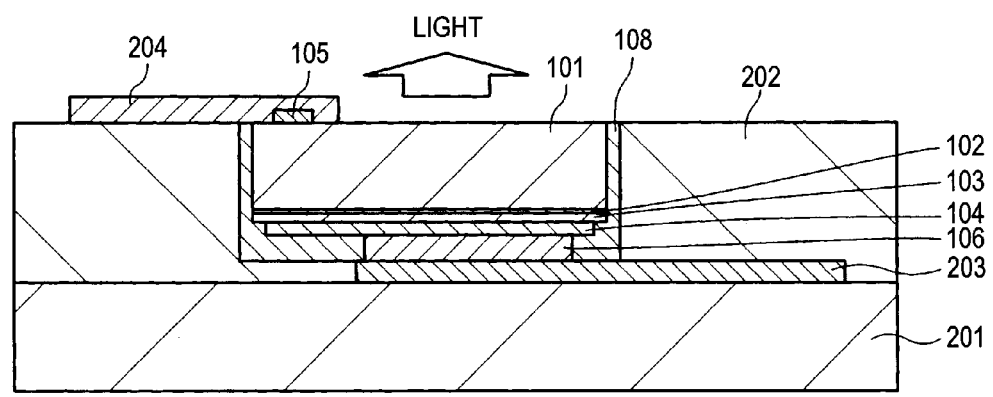

As shown in FIG. 13, in the sixth embodiment, a single pixel is formed by combining a light emitting diode 50R that emits red light, a light emitting diode 50G that emits green light and a light emitting diode 50B that emits blue light in the similar structure as that of the light emitting diode 10 or the light emitting diode 30 according to any one of the first to fifth embodiments, and this pixel is arranged in a matrix by a necessary number of the pixels on a substrate 21. On an n-side electrode of the light emitting diodes 50R, 50G and 50B, a wiring 24 is formed as similar to the first to fifth embodiments, and then a light emitting diode display is fabricated.

According to the sixth embodiment, the n-side electrode of the light emitting diodes 50R, 50G and 50B can be reliably connected to the wiring 24, and a highly reliable full color light emitting diode display can be implemented easily.

As described above, an embodiment has been described specifically, but an embodiment is not restricted to the embodiments described above, which can be modified variously based on the technical ideas according to an embodiment For example, the numeric values, materials, structures, shapes, substrates, raw materials, and processes named in the first to sixth embodiments are only examples, and different numeric values, materials, structures, shapes, substrates, raw materials, and processes may be used as necessary.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A method of forming a wiring of a light emitting device having an electrode on a light emission surface, the method comprising:

forming the electrode nearly in a linear shape in which the width is narrower than the light emission surface, wherein the electrode is formed directly on the light emission surface; and forming a wiring that is connected to the electrode nearly in a linear shape in which the width is narrower than the light emission surface to cross the electrode, wherein the light emitting device is a light emitting diode that has an end surface in which a semiconductor layer forming the structure of the light emitting diode is tilted at an angle $\theta_1$ to its main plane, and that includes a reflector outside the end surface, the reflector at least partially including a portion that is faced to the end surface and tilted to the main plane at an angle $\theta_2$ smaller than the angle $\theta_1$.

2. The method of forming a wiring of a light emitting device according to claim 1, wherein the wiring is formed so as to completely longitudinally cross the light emission surface.

3. The method of forming a wiring of a light emitting device according to claim 1, wherein the wiring is formed so as to almost orthogonally cross the electrode.

4. The method of forming a wiring of a light emitting device according to claim 1, wherein an outer part of the light emission surface has a portion almost in parallel with the wiring.

5. The method of forming a wiring of a light emitting device according to claim 1, wherein an outer part of the light emission surface has a portion that almost orthogonally crosses the wiring.

6. A substrate for mounting a light emitting device comprising:
a light emitting device having an electrode directly on a light emission surface, the light emitting device being mounted on the substrate,
wherein the electrode is formed nearly in a linear shape in which the width is narrower than the light emission surface, and
a wiring that is connected to the electrode is formed nearly in a linear shape in which the width is narrower than the light emission surface to cross the electrode, wherein the light emitting device is a light emitting diode that has an end surface in which a semiconductor layer forming the structure of the light emitting diode is tilted at an angle $\theta_1$ to its main plane, and that includes a reflector outside the end surface, the reflector at least partially including a portion that is faced to the end surface and tilted to the main plane at an angle $\theta_2$ smaller than the angle $\theta_1$.

7. The substrate for mounting a light emitting device according to claim 6, wherein the light emitting device is mounted on the substrate as the light emission surface is upward.

8. A display comprising:
a substrate for mounting a light emitting device in which the light emitting device having an electrode directly on a light emission surface is mounted on a substrate,
wherein the electrode is formed nearly in a linear shape in which the width is narrower than the light emission surface, and
a wiring that is connected to the electrode is formed nearly in a linear shape in which the width is narrower than the light emission surface to cross the electrode, wherein the light emitting device is a light emitting diode that has an end surface in which a semiconductor layer forming the structure of the light emitting diode is tilted at an angle $\theta_1$ to its main plane, and that includes a reflector outside the end surface, the reflector at least partially including a portion that is faced to the end surface and tilted to the main plane at an angle $\theta_2$ smaller than the angle $\theta_1$.

9. A back light comprising:
a substrate for mounting a light emitting device in which the light emitting device having an electrode directly on a light emission surface is mounted on a substrate,
wherein the electrode is formed nearly in a linear shape in which the width is narrower than the light emission surface, and
a wiring that is connected to the electrode is formed nearly in a linear shape in which the width is narrower than the light emission surface to cross the electrode, wherein the light emitting device is a light emitting diode that has an end surface in which a semiconductor layer forming the structure of the light emitting diode is tilted at an angle $\theta_1$ to its main plane, and that includes a reflector outside the end surface, the reflector at least partially including a portion that is faced to the end surface and tilted to the main plane at an angle $\theta_2$ smaller than the angle $\theta_1$.

10. An illuminating apparatus comprising:
a substrate for mounting a light emitting device in which the light emitting device having an electrode directly on a light emission surface is mounted on a substrate,
wherein the electrode is formed nearly in a linear shape in which the width is narrower than the light emission surface, and
a wiring that is connected to the electrode is formed nearly in a linear shape in which the width is narrower than the light emission surface to cross the electrode, wherein the light emitting device is a light emitting diode that has an end surface in which a semiconductor layer forming the structure of the light emitting diode is tilted at an angle $\theta_1$ to its main plane, and that includes a reflector outside the end surface, the reflector at least partially including a portion that is faced to the end surface and tilted to the main plane at an angle $\theta_2$ smaller than the angle $\theta_1$.

11. An electronic appliance comprising:
a substrate for mounting a light emitting device in which the light emitting device having an electrode directly on a light emission surface is mounted on a substrate,
wherein the electrode is formed nearly in a linear shape in which the width is narrower than the light emission surface, and
a wiring that is connected to the electrode is formed nearly in a linear shape in which the width is narrower than the light emission surface to cross the electrode, wherein the light emitting device is a light emitting diode that has an end surface in which a semiconductor layer forming the structure of the light emitting diode is tilted at an angle $\theta_1$ to its main plane, and that includes a reflector outside the end surface, the reflector at least partially including a portion that is faced to the end surface and tilted to the main plane at an angle $\theta_2$ smaller than the angle $\theta_1$.

* * * * *